(12) United States Patent
Mayer et al.

(10) Patent No.: US 11,977,904 B2
(45) Date of Patent: *May 7, 2024

(54) SYSTEMS AND METHODS FOR ROBOTIC PROCESS AUTOMATION OF MOBILE PLATFORMS

(71) Applicant: UiPath Inc., New York, NY (US)

(72) Inventors: Christian Mayer, Vienna (AT); Gerd Weishaar, Vienna (AT); Bogdan Cucosel, Chitila (RO)

(73) Assignee: UiPath Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/312,869

(22) Filed: May 5, 2023

(65) Prior Publication Data

US 2023/0273805 A1 Aug. 31, 2023

Related U.S. Application Data

(63) Continuation of application No. 18/312,041, filed on May 4, 2023, which is a continuation of application
(Continued)

(51) Int. Cl.
*G06F 9/451* (2018.01)
*G06F 3/01* (2006.01)
(Continued)

(52) U.S. Cl.
CPC .............. *G06F 9/452* (2018.02); *G06F 3/017* (2013.01); *G06F 9/547* (2013.01); *G05B 2219/40391* (2013.01); *G05B 2219/40392* (2013.01); *G05B 2219/40393* (2013.01); *G06F 8/34* (2013.01); *G06F 16/358* (2019.01); *G06F 16/84* (2019.01); *G06F 30/13* (2020.01); *G06F 30/27* (2020.01);
(Continued)

(58) Field of Classification Search
CPC .......... G06F 9/452; G06F 3/017; G06F 9/547; G06F 8/34; G06F 16/358; G06F 16/84; G06F 30/13; G06F 30/27; G06F 9/45508; G05B 2219/40391; G05B 2219/40392; G05B 2219/40393; G06N 3/008; G06N 5/013; G06N 5/022; G06N 7/01; H04L 67/133; H04L 67/535; H04L 67/12
See application file for complete search history.

(56) References Cited

U.S. PATENT DOCUMENTS 9,817,967 B1 * 11/2017 Shukla .................... G06F 21/45
11,054,960 B1 * 7/2021 Munteanu .............. G06N 20/00
(Continued)

*Primary Examiner* — Quoc A Tran
(74) *Attorney, Agent, or Firm* — Law Office of Andrei D Popovici, PC

(57) ABSTRACT

In some embodiments, a robotic process automation (RPA) design application provides a user-friendly graphical user interface that unifies the design of automation activities performed on desktop computers with the design of automation activities performed on mobile computing devices such as smartphones and wearable computers. Some embodiments connect to a model device acting as a substitute for an actual automation target device (e.g., smartphone of specific make and model) and display a model GUI mirroring the output of the respective model device. Some embodiments further enable the user to design an automation workflow by directly interacting with the model GUI.

19 Claims, 17 Drawing Sheets

Related U.S. Application Data

No. 17/658,682, filed on Apr. 11, 2022, now Pat. No. 11,656,883, which is a continuation of application No. 15/929,895, filed on May 28, 2020, now Pat. No. 11,314,531.

(51) Int. Cl.
| | | |
|---|---|---|
| *G06F 8/34* | (2018.01) | |
| *G06F 9/54* | (2006.01) | |
| *G06F 16/35* | (2019.01) | |
| *G06F 16/84* | (2019.01) | |
| *G06F 30/13* | (2020.01) | |
| *G06F 30/27* | (2020.01) | |
| *G06N 3/008* | (2023.01) | |
| *G06N 5/01* | (2023.01) | |
| *G06N 5/022* | (2023.01) | |
| *G06N 7/01* | (2023.01) | |
| *H04L 67/133* | (2022.01) | |
| *H04L 67/50* | (2022.01) | |

(52) U.S. Cl.
CPC .............. *G06N 3/008* (2013.01); *G06N 5/013* (2023.01); *G06N 5/022* (2013.01); *G06N 7/01* (2023.01); *H04L 67/133* (2022.05); *H04L 67/535* (2022.05)

(56) References Cited

U.S. PATENT DOCUMENTS

2019/0138596 A1* 5/2019 Singh ................. G06F 16/84
2020/0206920 A1* 7/2020 Ma ..................... G06F 11/3438

\* cited by examiner

SYSTEMS AND METHODS FOR ROBOTIC PROCESS AUTOMATION OF MOBILE PLATFORMS

CROSS-REFERENCE TO RELATED APPLICATIONS

This application is a continuation of U.S. patent application Ser. No. 18/312,041, filed on May 4, 2023, titled "Systems and Methods for Robotic Process Automation of Mobile Platforms," which is a continuation of U.S. patent application Ser. No. 17/658,682, filed on Apr. 11, 2022, issued on May 23, 2023 as U.S. Pat. No. 11,656,883, which in turn is a continuation of U.S. patent application Ser. No. 15/929,895, filed on May 28, 2020, issued as U.S. Pat. No. 11,314,531 on Apr. 26, 2022, all of which are incorporated by reference herein.

BACKGROUND OF THE INVENTION

The invention relates to robotic process automation (RPA), and in particular to systems and methods for performing RPA on mobile computing platforms such as handheld electronic devices (smartphones, tablet computers, wearable computing devices, etc.).

RPA is an emerging field of information technology aimed at improving productivity by automating repetitive computing tasks, thus freeing human operators to perform more intellectually sophisticated and/or creative activities. Notable tasks targeted for automation include, among others, extracting structured data from documents, form filling, generating complex reports, and transferring data among various software applications which are not specifically configured to communicate with each other.

Automation of mobile computation platforms such as smartphones presents special technical challenges, firstly because their hardware and software are substantially more heterogeneous than those of classical desktop computers. Device models from different producers and running different operating systems may have different ways of managing user interfaces and different security requirements and restrictions. Therefore, successfully implementing RPA on such platforms may require substantial knowledge of hardware and software engineering. Furthermore, users may interact with handheld computing devices in ways which differ from the way a desktop computer is used. Examples include user gestures such as tapping, swiping, pinching, and pressing the touchscreen, as well as changing the inclination and orientation of the respective device. Conventional RPA targeted at desktop computers and servers may therefore not easily translate to mobile platforms.

A distinct prong of RPA development is directed at simplifying the programming, management, and deployment of software robots, with the ultimate goal of extending the reach of RPA technology to users that lack advanced programming skills or training. One way of making RPA more accessible is the development of RPA-oriented integrated development environments (IDEs) which allow the programming of robots via graphical user interface (GUI) tools, instead of coding per se. There is a strong interest in making such GUI tools as intuitive and user-friendly as possible, to attract a broad audience of developers.

SUMMARY OF THE INVENTION

According to one aspect, a method comprises employing at least one hardware processor of a computer system to display a desktop graphical user interface (GUI) and a model GUI on a screen of the computer system. The model GUI mimics a display of a mobile computing device targeted for robotic process automation (RPA). The method further comprises employing the at least one hardware processor to construct an RPA workflow comprising a first RPA activity for interacting with a desktop computer and a second RPA activity for interacting with the mobile computing device. Constructing the RPA workflow comprises receiving a first user input to the desktop GUI, in response to the first user input, configuring the first RPA activity according to the first user input, receiving a second user input to the model GUI, and in response to the second user input, configuring the second RPA activity according to the second user input. The method further comprises employing the at least one hardware processor to generate at least one robot specification according to the RPA workflow, the at least one robot specification instructing a first RPA robot to carry out the first RPA activity on the desktop computer and instructing a second RPA robot to carry out the second RPA activity on the mobile computing device.

According to another aspect, a computer system comprises at least one hardware processor configured to display a desktop GUI and a model GUI on a screen of the computer system. The model GUI mimics a display of a mobile computing device targeted for RPA. The at least one hardware processor is further configured to construct an RPA workflow comprising a first RPA activity for interacting with a desktop computer and a second RPA activity for interacting with the mobile computing device. Constructing the RPA workflow comprises receiving a first user input to the desktop GUI, in response to the first user input, configuring the first RPA activity according to the first user input, receiving a second user input to the model GUI, and in response to the second user input, configuring the second RPA activity according to the second user input. The at least one hardware processor is further configured to generate at least one robot specification according to the RPA workflow, the at least one robot specification instructing a first RPA robot to carry out the first RPA activity on the desktop computer and instructing a second RPA robot to carry out the second RPA activity on the mobile computing device.

According to another aspect, a non-transitory computer-readable medium stores instructions which, when executed by at least one hardware processor of a computer system, cause the computer system to display a desktop GUI and a model GUI on a screen of the computer system. The model GUI mimics a display of a mobile computing device targeted for RPA. The instructions further cause the computer system to construct an RPA workflow comprising a first RPA activity for interacting with a desktop computer and a second RPA activity for interacting with the mobile computing device. Constructing the RPA workflow comprises receiving a first user input to the desktop GUI, in response to the first user input, configuring the first RPA activity according to the first user input, receiving a second user input to the model GUI, and in response to the second user input, configuring the second RPA activity according to the second user input. The instructions further cause the computer system to generate at least one robot specification according to the RPA workflow, the at least one robot specification instructing a first RPA robot to carry out the first RPA activity on the desktop computer and instructing a second RPA robot to carry out the second RPA activity on the mobile computing device.

BRIEF DESCRIPTION OF DRAWINGS

The foregoing aspects and advantages of the present invention will become better understood upon reading the following detailed description and upon reference to the drawings where.

DETAILED DESCRIPTION OF THE INVENTION

In the following description, it is understood that all recited connections between structures can be direct operative connections or indirect operative connections through intermediary structures. A set of elements includes one or more elements. Any recitation of an element is understood to refer to at least one element. A plurality of elements includes at least two elements. Any use of 'or' is meant as a nonexclusive or. Unless otherwise required, any described method steps need not be necessarily performed in a particular illustrated order. A first element (e.g. data) derived from a second element encompasses a first element equal to the second element, as well as a first element generated by processing the second element and optionally other data. Making a determination or decision according to a parameter encompasses making the determination or decision according to the parameter and optionally according to other data. Unless otherwise specified, an indicator of some quantity/data may be the quantity/data itself, or an indicator different from the quantity/data itself. Mobile computing devices comprise mobile telephones (smartphones), tablet computers, other handheld touchscreen computing devices, and wearable computing devices, among others. A computer program is a sequence of processor instructions carrying out a task. Computer programs described in some embodiments of the present invention may be stand-alone software entities or sub-entities (e.g., subroutines, libraries) of other computer programs. The term 'database' is used herein to denote any organized, searchable collection of data. Computer-readable media encompass non-transitory media such as magnetic, optic, and semiconductor storage media (e.g. hard drives, optical disks, flash memory, DRAM), as well as communication links such as conductive cables and fiber optic links. According to some embodiments, the present invention provides, inter alia, computer systems comprising hardware (e.g. one or more processors) programmed to perform the methods described herein, as well as computer-readable media encoding instructions to perform the methods described herein.

The following description illustrates embodiments of the invention by way of example and not necessarily by way of limitation.

Figure 1:
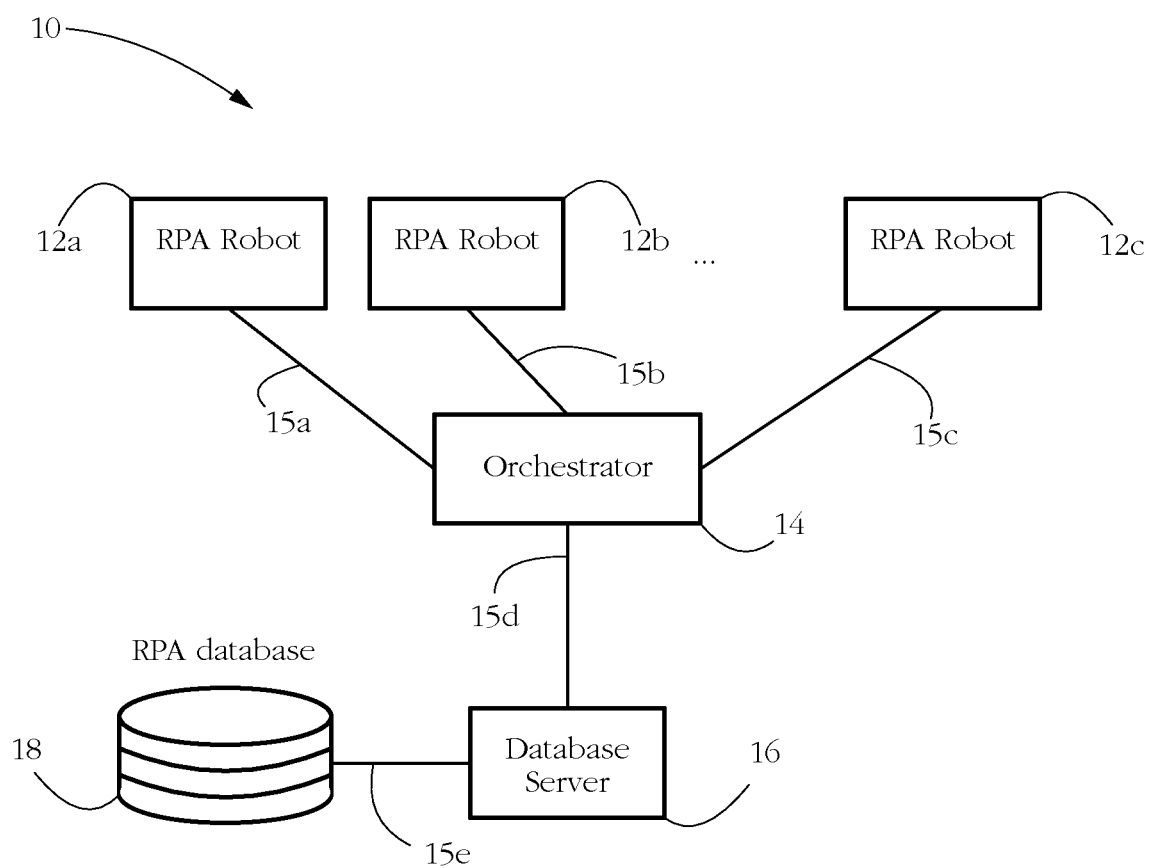
FIG. 1 shows an exemplary robotic process automation (RPA) environment according to some embodiments of the present invention.

FIG. 1 shows an exemplary robotic process automation (RPA) environment 10 according to some embodiments of the present invention. Environment 10 comprises various software components which collaborate to achieve the automation of a particular task. In an exemplary RPA scenario, an employee of a company uses a business application (e.g., word processor, spreadsheet editor, browser, email application) to perform a repetitive task, for instance to issue invoices to various clients. To actually carry out the respective task, the employee performs a sequence of operations/actions, which is herein deemed a business process. Exemplary operations forming a part of an invoice-issuing business process may include opening a Microsoft Excel® spreadsheet, looking up company details of a client, copying the respective details into an invoice template, filling out invoice fields indicating the purchased items, switching over to an email application, composing an email message to the respective client, attaching the newly created invoice to the respective email message, and clicking a 'Send' button. Various elements of RPA environment 10 may automate the respective business process by mimicking the set of operations performed by the respective human operator in the course of carrying out the respective task.

Mimicking a human operation/action is herein understood to encompass reproducing the sequence of computing events that occur when a human operator performs the respective operation/action on the computer, as well as reproducing a result of the human operator's performing the respective operation on the computer. For instance, mimicking an action of clicking a button of a graphical user interface may comprise having the operating system move the mouse pointer to the respective button and generating a mouse click event, or may alternatively comprise toggling the respective GUI button itself to a clicked state.

Processes typically targeted for such automation include processing of payments, invoicing, communicating with business clients (e.g., distribution of newsletters and/or product offerings), internal communication (e.g., memos, scheduling of meetings and/or tasks), auditing, and payroll processing, among others. In some embodiments, a dedicated RPA design application 30 (FIG. 2) enables a human developer to design a software robot to implement workflows that effectively automate business processes by giving the developer control of the execution order and the relationship between a custom set of automation steps developed in a workflow, steps herein deemed "activities." Each activity may include an action, such as clicking a button, reading a file, writing to a spreadsheet cell, etc. In some embodiments, workflows may be nested or embedded. One commercial example of an embodiment of RPA design application 30 is UiPath Studio™.

Some types of workflows may include, but are not limited to, sequences, flowcharts, finite state machines (FSMs), and/or global exception handlers. Sequences may be particularly suitable for linear processes, enabling flow from one activity to another without cluttering a workflow. Flowcharts may be particularly suitable to more complex business logic, enabling integration of decisions and connection of activities in a more diverse manner through multiple branching logic operators. FSMs may be particularly suitable for large workflows. FSMs may use a finite number of states in their execution, which are triggered by a condition (i.e., transition) or an activity. Global exception handlers may be particularly suitable for determining workflow behavior when encountering an execution error and for debugging processes.

Figure 2:
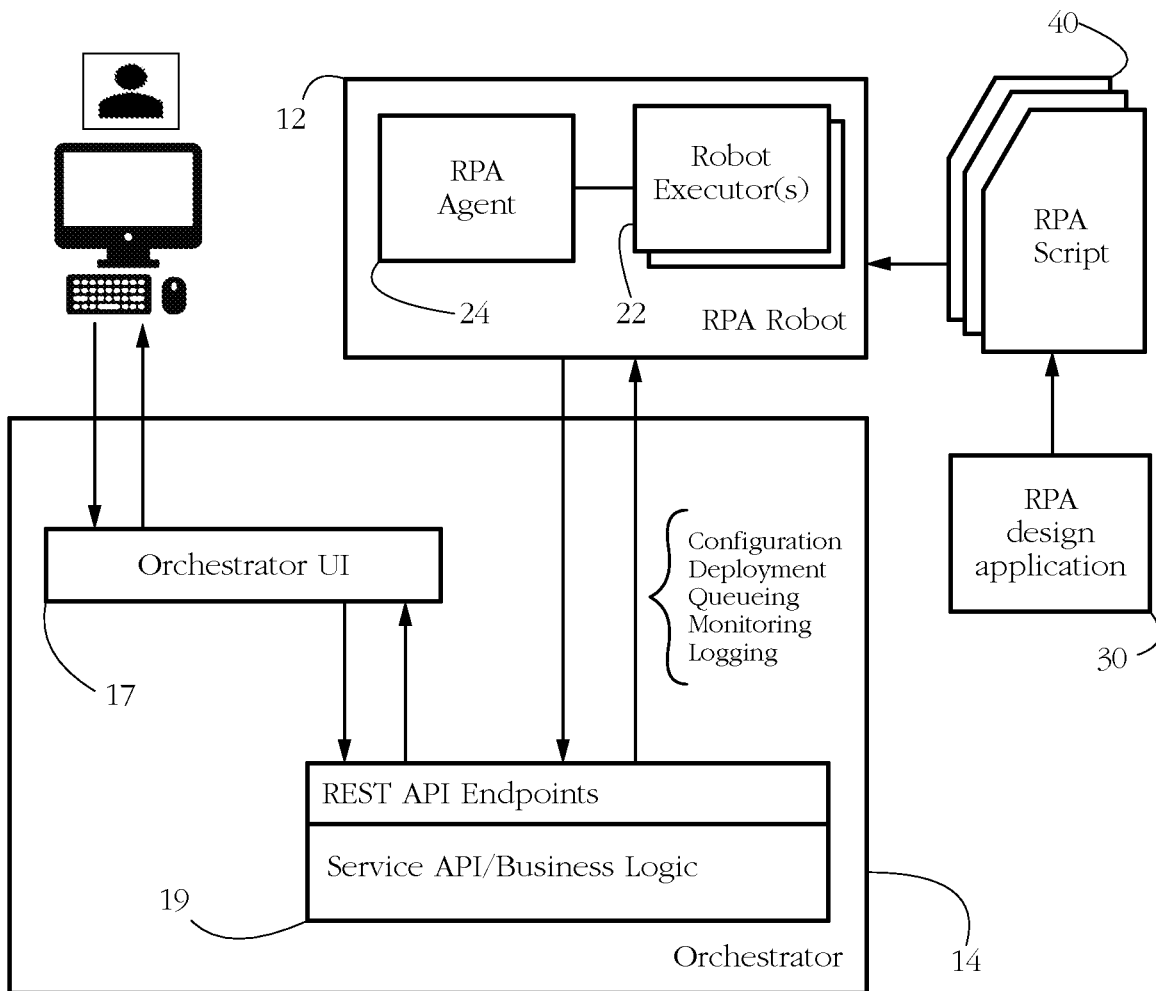
FIG. 2 illustrates exemplary components and operation of an RPA robot and orchestrator according to some embodiments of the present invention.

Once a workflow is developed, it may be encoded in computer-readable form as a set of RPA scripts 40 (FIG. 2). RPA scripts 40 may be formulated according to any data specification known in the art, for instance in a version of an extensible markup language (XML), Javascript Object Notation (JSON), or a programming language such as C#, Visual Basic, Java, etc. Alternatively, RPA scripts 40 may be formulated in an RPA-specific version of bytecode, or even as a sequence of instructions formulated in a natural language such as English, Spanish, Japanese, etc. In some embodiments, scripts 40 are pre-compiled into a set of native processor instructions (e.g., machine code).

Scripts 40 may then be executed by a set of robots 12a-c (FIG. 1), which may be further controlled and coordinated by an orchestrator 14. Robots 12a-c and orchestrator 14 may each comprise a plurality of computer programs, which may or may not execute on the same physical machine. Exemplary commercial embodiments of robots 12a-c and orchestrator 14 include UiPath Robots™ and UiPath Orchestrator™, respectively. Types of robots 12a-c include, but are not limited to, attended robots, unattended robots, development robots (similar to unattended robots, but used for development and testing purposes), and nonproduction robots (similar to attended robots, but used for development and testing purposes).

Attended robots are triggered by user events and/or commands and operate alongside a human operator on the same computing system. In some embodiments, attended robots can only be started from a robot tray or from a command prompt and thus cannot be controlled from orchestrator 14 and cannot run under a locked screen, for example. Unattended robots may run unattended in remote virtual environments and may be responsible for remote execution, monitoring, scheduling, and providing support for work queues.

Orchestrator 14 may have various capabilities including, but not limited to, provisioning, deployment, configuration, queueing, monitoring, logging, and/or providing interconnectivity for robots 12a-c. Provisioning may include creating and maintaining connections between robots 12a-c and orchestrator 14. Deployment may include ensuring the correct delivery of software (e.g, RPA scripts 40) to robots 12a-c for execution. Configuration may include maintenance and delivery of robot environments and workflow configurations. Queueing may include providing management of queues and queue items. Monitoring may include keeping track of robot state and maintaining user permissions. Logging may include storing and indexing logs to a database and/or another storage mechanism (e.g., SQL, ElasticSearch™, Redis™). Orchestrator 14 may further act as a centralized point of communication for third-party solutions and/or applications.

FIG. 2 shows exemplary components of a robot 12 and orchestrator 14 according to some embodiments of the present invention. An exemplary RPA robot is constructed using a Windows™ Workflow Foundation Application Programming Interface from Microsoft®, Inc. Robot 12 may comprise a set of executors 22 and an RPA agent 24. Robot executors 22 are configured to receive RPA script 40 indicating a sequence of activities that mimic the actions of a human operator carrying out a business process, and to actually execute the respective sequence of activities on the respective client machine. In some embodiments, robot executor(s) 22 comprise an interpreter (e.g., a just-in-time interpreter or compiler) configured to translate RPA script 40 into a runtime package comprising processor instructions for carrying out the operations described in the respective script. Executing script 40 may thus comprise executor(s) 22 translating RPA script 40 and instructing a processor of the respective host machine to load the resulting runtime package into memory and to launch the runtime package into execution.

RPA agent 24 may manage the operation of robot executor(s) 22. For instance, RPA agent 24 may select tasks/scripts for execution by robot executor(s) 22 according to an input from a human operator and/or according to a schedule. Agent 24 may start and stop jobs and configure various operational parameters of executor(s) 22. When robot 12 includes multiple executors 22, agent 24 may coordinate their activities and/or inter-process communication. RPA agent 24 may further manage communication between RPA robot 12 and orchestrator 14 and/or other entities.

In some embodiments executing in a Windows™ environment, robot 12 installs a Microsoft Windows™ Service Control Manager (SCM)-managed service by default. As a result, such robots can open interactive Windows™ sessions under the local system account and have the processor privilege of a Windows™ service. For instance, a console application may be launched by a SCM-managed robot. In some embodiments, robot 12 can be installed at a user level of processor privilege (user mode, ring 3.) Such a robot has the same rights as the user under which the respective robot has been installed. For instance, such a robot may launch any application that the respective user can. On computing systems that support multiple interactive sessions running simultaneously (e.g., Windows™ Server 2012), multiple robots may be running at the same time, each in a separate Windows™ session, using different usernames.

In some embodiments, robot 12 and orchestrator 14 may execute in a client-server configuration. It should be noted that the client side, the server side, or both, may include any desired number of computing systems (e.g., physical or virtual machines) without deviating from the scope of the invention. In such configurations, robot 12 including executor(s) 22 and RPA agent 24 may execute on a client side. Robot 12 may run several workflows concurrently. RPA agent 24 (e.g., a Windows™ service) may act as a single client-side point of contact of executors 22. Agent 24 may further manage communication between robot 12 and orchestrator 14. In some embodiments, communication is initiated by agent 24, which may open a WebSocket channel to orchestrator 14. Agent 24 may subsequently use the channel to transmit notifications regarding the state of each executor 22 to orchestrator 14. In turn, orchestrator 14 may use the channel to transmit acknowledgements, job requests, and other data such as RPA scripts 40 to robot 12.

Orchestrator 14 may execute on a server side, possibly distributed over multiple physical machines. In one such embodiment, orchestrator 14 may include an orchestrator user interface (UI) 17 which may be a web application, and a set of service modules 19. Service modules 19 may further include a set of Open Data Protocol (OData) Representational State Transfer (REST) Application Programming Interface (API) endpoints, and a set of service APIs/business logic. A user may interact with orchestrator 14 via orchestrator UI 17 (e.g., by opening a dedicated orchestrator interface on a browser), to instruct orchestrator 14 to carry out various actions, which may include for instance starting jobs on robot 12, creating robot groups, assigning workflows to robots, adding/removing data in queues, scheduling jobs to run unattended, analyzing logs per robot or workflow, etc. Orchestrator UI 17 may use Hypertext Markup Language (HTML), JavaScript (JS), or any other data format known in the art.

Orchestrator 14 may carry out actions requested by the user by selectively calling service APIs/business logic. In addition, orchestrator 14 may use the REST API endpoints to communicate with robot 12. The REST API may include configuration, logging, monitoring, and queueing functionality. The configuration endpoints may be used to define and configure application users, permissions, robots, assets, releases, etc. Logging REST endpoints may be used to log different information, such as errors, explicit messages sent by the robots, and other environment-specific information, for instance. Deployment REST endpoints may be used by robots to query the version of RPA script 40 to be executed. Queueing REST endpoints may be responsible for queues and queue item management, such as adding data to a queue, obtaining a transaction from the queue, setting the status of a transaction, etc. Monitoring REST endpoints may monitor the web application component of orchestrator 14 and RPA agent 24.

In some embodiments, RPA environment 10 (FIG. 1) further comprises a database server 16 connected to an RPA database 18. In an embodiment wherein server 16 is provisioned on a cloud computing platform, server 16 may be embodied as a database service, e.g., as a client having a set of database connectors. Database server 16 is configured to selectively store and/or retrieve data related to RPA environment 10 in/from database 18. Such data may include configuration parameters of various robots 12a-c, robot groups, as well as data characterizing workflows executed by various robots, and data characterizing users, roles, schedules, queues, etc. Another exemplary category of data stored and/or retrieved by database server 16 includes data characterizing the current state of each executing robot. Yet another exemplary category of data includes messages logged by various robots during execution. Database server 16 and database 18 may employ any data storage protocol and format known in the art, such as structured query language (SQL), ElasticSearch™, and Redis™, among others. In some embodiments, data is gathered and managed by orchestrator 14, for instance via logging REST endpoints. Orchestrator 14 may further issue structured queries to database server 16.

In some embodiments, RPA environment 10 (FIG. 1) further comprises communication channels/links 15a-e interconnecting various members of environment 10. Such links may be implemented according to any method known in the art, for instance as virtual network links, virtual private networks (VPN), or end-to-end tunnels. Some embodiments further encrypt data circulating over some or all of links 15a-e.

Figure 3:
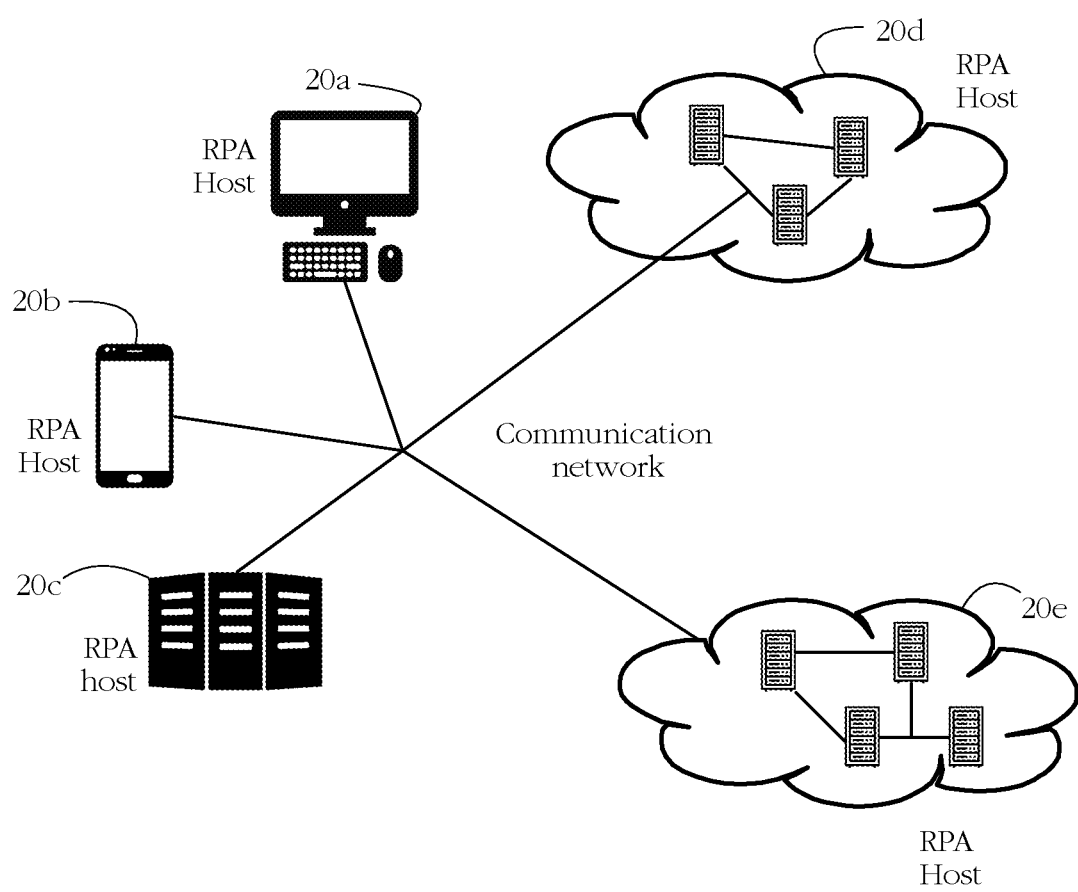
FIG. 3 shows a variety of RPA host systems according to some embodiments of the present invention.

A skilled artisan will understand that various components of RPA environment 10 may be implemented and/or may execute on distinct host computer systems (physical appliances and/or virtual machines). FIG. 3 shows a variety of such RPA host systems 20a-e according to some embodiments of the present invention. Each host system 20a-e represents a computing system (e.g. an individual computing appliance, or a set of interconnected computers) having at least a hardware processor, a memory unit and a network adapter enabling the respective RPA host to connect to a computer network and/or to other computing devices. Exemplary RPA hosts 20a-c include personal computers, laptop and tablet computers, mobile telecommunication devices (e.g., smartphones), and corporate mainframe computers, among others. Other exemplary hosts illustrated as hosts 20d-e include cloud computing platforms such as server farms operated by Amazon™ AWS and Microsoft™ Azure™. A cloud computing platform comprises a plurality of interconnected server computer systems centrally-managed according to a platform-specific protocol. Clients may interact with such cloud computing platforms using platform-specific interfaces/software layers/libraries (e.g., software development kits—SDKs, plugins, etc.) and/or a platform-specific syntax of commands. Exemplary platform-specific interfaces include the Azure™ SDK and AWS™ SDK, among others.

Figure 4:
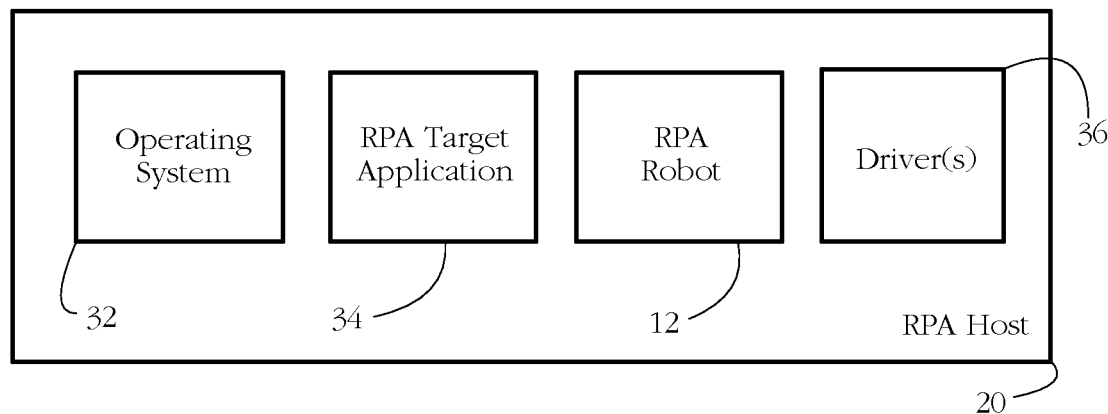
FIG. 4 shows exemplary RPA components executing on an RPA host according to some embodiments of the present invention.

FIG. 4 shows exemplary software executing on an RPA host 20 according to some embodiments of the present invention. The illustrated RPA host 20 may represent any of RPA hosts 20a-e in FIG. 3. In some embodiments, beside an RPA robot 12, RPA host 20 executes an operating system (OS) 32 and an instance of an RPA target application 34, i.e., the software application targeted for automation by robot 12.

In some embodiments that employ hardware virtualization technologies, some or all of the illustrated components may execute within a virtual machine (VM).

OS 32 may comprise any widely available operating system such as Microsoft Windows™, MacOS™, Linux™, iOS™, or Android™, among others, comprising a software layer that interfaces between application 34 and the hardware of RPA host 20. RPA target application 34 generically represents any computer program used by a human operator to carry out a task. Exemplary applications 34 include, among others, a word processor, a spreadsheet application, a graphics application, a browser, a social media application, a gaming application, and an electronic communication application.

In some embodiments, robot 12 carries out user interface automation activities by interfacing with a set of drivers 36 executing on the respective host. Driver(s) 36 generically represent software modules that carry low-level operations such as moving a cursor on screen, registering and/or executing mouse, keyboard, and/or touchscreen events, detecting a current posture/orientation of a handheld device, detecting a current accelerometer reading, taking a photograph with a smartphone camera, etc. Some such drivers 36 form a part of operating system 30. Others may implement various application-specific aspects of a user's interaction with complex target applications 34 such as SAP™, Citrix™ virtualization software, Excel™, etc. Such drivers 36 may include, for instance, browser drivers, virtualization drivers, and enterprise application drivers, among others. Exemplary drivers 36 include the Microsoft™ WinAppDriver, XCTest drivers from Apple, Inc., and UI Automator drivers from Google, Inc.

Figure 5:
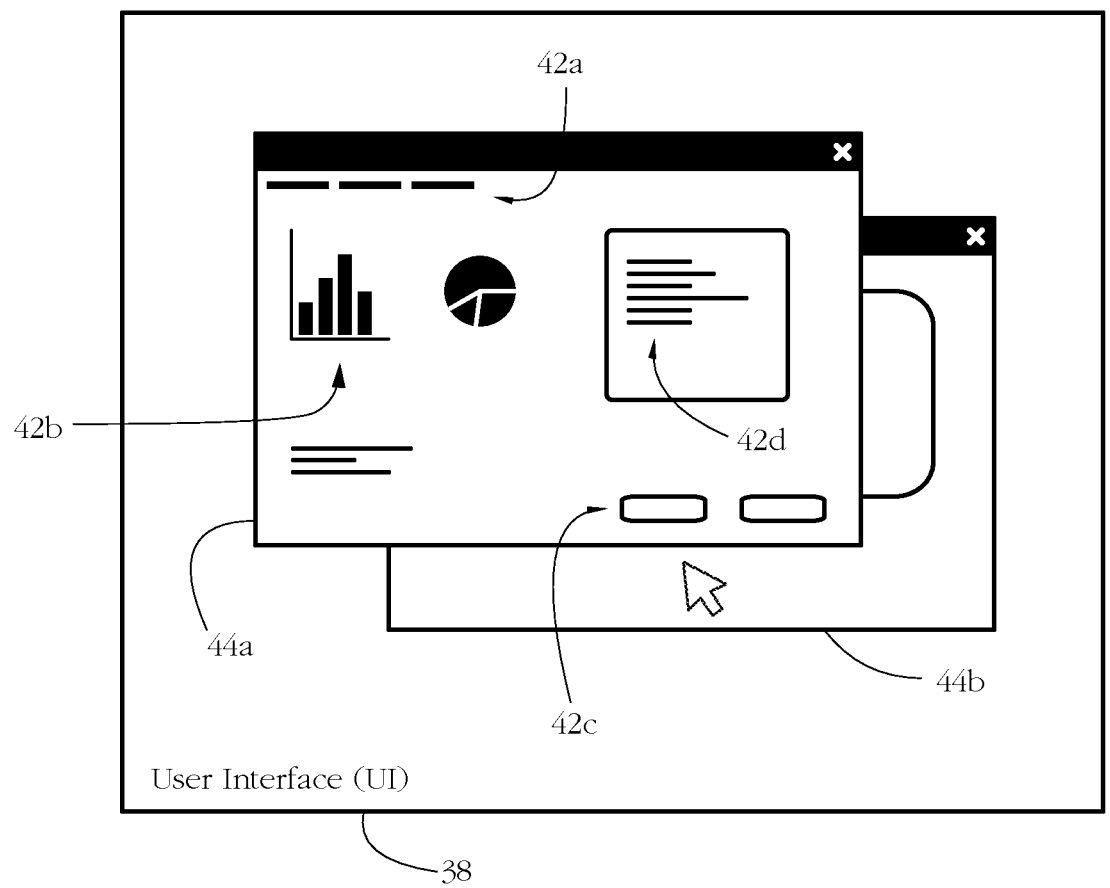
FIG. 5 shows an exemplary graphical user interface (GUI) having a plurality of GUI elements according to some embodiments of the present invention.

RPA target application 34 is configured to expose a user interface (UI). A user interface is a computer interface that enables human-machine interaction, e.g., an interface configured to receive user input and to respond to the respective input. A common example of user interface is known as a graphical user interface (GUI), which enables human-machine interaction via a set of visual elements displayed to the user. FIG. 5 shows such an exemplary GUI 38 according to some embodiments of the present invention. Illustrative GUI 38 has a set of exemplary windows 44a-b and a set of exemplary UI elements including a menu indicator 42a, an icon 42b, a button 42c, and a text box 42d. Other exemplary UI elements comprise, among others, a window, a label, a form, an individual form field, a toggle, a link (e.g., a hyperlink, hypertext, or a uniform resource identifier). UI elements may display information, receive input (text, mouse events,) and/or control a functionality of software and/or the respective computer system.

Some UI elements are interactive in the sense that acting on them (e.g., clicking button 42c) triggers a behavior/reaction. Such behaviors/reactions are typically specific to the respective element or to a group of elements. For instance, clicking a save button produces a different effect to clicking a print button. The same keyboard shortcut (e.g., Ctrl-G) may have one effect when executed in one window/application, and a completely different effect when executed in another window/application. So, although the operation/action/activity is the same (executing a click, pressing a combination of keyboard keys, writing a sequence of characters, etc.), the result of the respective action may depend substantially on the operand of the respective operation. An operand is herein defined as the UI element that is acted upon by a current activity such as a click or a keyboard event, or stated otherwise, the UI element selected to receive the respective user input. The terms 'operand' and 'target' are herein used interchangeably.

Some embodiments attach a selector to each target UI element, the selector comprising a data structure that selectively identifies the respective element among the plurality of UI elements of UI interface 38. In one exemplary embodiment, the selector indicates a position of the respective UI element in an object hierarchy of UI interface 38, such as a GUI tree or DOM model. GUI object hierarchies may be encoded in computer-readable form in a language such as XML or JSON, among others. One exemplary selector may indicate that the respective UI element is a form field of a specific form displayed within a specific UI window. The selector of a target UI element may be specified at design time by including an encoding of the respective selector in an RPA script configured to carry out an activity on the respective UI element. At runtime, robot 12 may attempt to identify the target UI element within a runtime instance of the target UI according to the respective selector and possibly according to other information such as an image of the respective UI element and/or a text displayed on the respective UI element.

Figure 6:
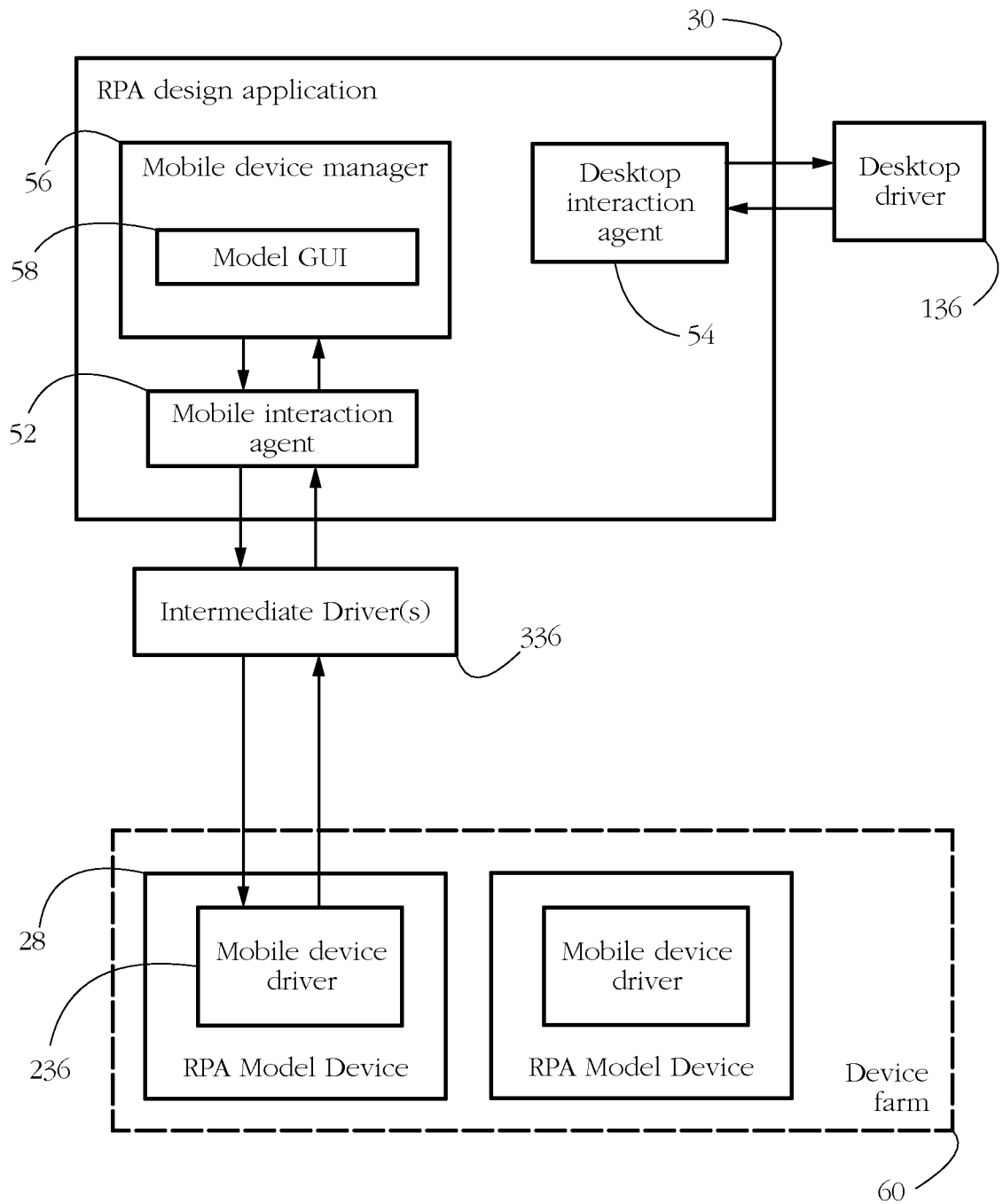
FIG. 6 shows an exemplary RPA design application interacting with an RPA model device according to some embodiments of the present invention.

FIG. 6 shows an exemplary RPA design application 30 interacting with an RPA model device 28 to facilitate the development of RPA software according to some embodiments of the present invention. RPA design application 30 may function like an integrated development environment (IDE), comprising a code editor and/or a graphical user interface enabling the operator to use with a set of interactive tools for modeling a business process.

In some embodiments, RPA model device 28 comprises an instance of a mobile computing device such as a smartphone or a tablet computer, model device 28 acting as a substitute for the actual RPA host meant to execute the automation currently being designed/developed using RPA design application 30. One example of model device 28 consists of a physical appliance, e.g., a mobile phone of a specific make and model, having a specific hardware and/or software configuration and communicatively coupled to the computer system executing application 30. Another example of RPA model device 28 comprises an emulation of a physical device, i.e., a set of software modules that reproduce the behavior of a real, physical appliance such as a smartphone. For instance, model device 28 may include a virtual machine comprising an abstraction/virtualization of a respective physical device, the virtual machine capable of executing an operating system and an RPA target application. Such device emulator(s) and/or virtual machines may or may not execute on the same physical computer as RPA design application 30. In some embodiments, RPA model device 28 may operate as a web service accessible via a remote server computer system, for instance as part of a device farm 60. Several such services are available commercially.

In some embodiments, RPA model device 28 includes a mobile device driver 236 implementing the functionality of a robot driver (see e.g., description of driver 36 in FIG. 4.) Driver 236 may enable a user to remotely interact with a user interface exposed by model device 28, by mimicking a human action such as tapping on a button, swiping, grabbing a section of text displayed on screen, and filling in a form field, among others. Exemplary mobile device drivers 236 include the open source WebDriver, Selenium™, and Appium™ drivers, as well as the XCTest driver for iOS™ and UI Automator drivers from Google™, Inc.

In some embodiments, RPA design application 30 comprises a mobile device manager module 56 configured to manage the interaction with RPA model device 28. Mobile device manager 56 may execute as a component (e.g., library) of application 30 or as a separate software entity communicatively coupled to RPA design application 30. Managing the interaction with RPA model device 28 may include for instance negotiating and/or establishing a connection to device 28.

When RPA model device 28 executes remotely, establishing the connection may include transmitting a request to the respective device provider (e.g., device farm 60), the request specifying a selected device type and/or configuration, receiving from the provider a location indicator (e.g., uniform resource locator—URL, IP address, etc.) indicating a network location of the requested RPA model device, and accessing the respective network location. When RPA model device 28 comprises an emulated device, establishing the connection may include initiating an instantiation of the respective emulated device, for instance by transmitting a command to a device emulator (e.g., device farm 60), the command configured to cause the device emulator to create an instance of an emulated device with a set of specifications indicated in the command. Mobile device manager module 56 may further request that RPA model device 28 be provisioned with an instance of RPA target application 34, for instance by transmitting to the device provider a network address (e.g., URL) of an executable file of the respective application.

Once a connection is established, mobile device manager 56 may interact with RPA model device 28 via message exchanges formulated according to any protocol and/or data format known in the art, for instance according to a hypertext transfer protocol (HTTP) using messages formulated in HTML and/or JavaScript. In some embodiments, such communication between mobile device manager 56 and RPA model device 28 is carried out via a set of intermediate drivers 336. Such intermediate driver(s) may facilitate software development by providing a unified framework for communicating with a variety of drivers, for instance both iOS™ and Android™ drivers. Examples of intermediate drivers include the Appium™ server, among others. Drivers 336 may execute on RPA model device 28, on the machine executing RPA design application 30, or on a third-party server computer system.

In some embodiments, mobile device manager 56 and RPA design application 30 employ a dedicated software component (e.g., module, library, etc,) illustrated as mobile interaction agent 52 in FIG. 6, to issue commands and/or receive data to/from mobile device driver 236. Such commands may instruct driver 236 to execute an action indicated by a user of RPA design application 30, for instance to tap on a button exposed by RPA model device 28. In parallel to mobile interaction agent 52, some embodiments of RPA design application 30 further comprise a desktop interaction agent 54 configured to transmit commands and/or receive data to/from communicate with a desktop driver 136 enabling the automation of a set of desktop-specific RPA activities, such as mouse clicks, among others. Driver 136 may be a local driver executing on the physical machine executing application 30, or an emulated driver possibly executing on a remote computer system.

Mobile device manager 56 may further comprise a model GUI 58 configured to expose to a user a virtual display that mirrors an actual display exposed by the currently connected RPA model device 28. In one exemplary embodiment, GUI 58 comprises a web browser interface configured to render the virtual display according to an HTML and/or JavaScript encoding of the respective display received from RPA model device 28. The functionality of mobile device manager 56 in relation to model GUI 58 is further detailed below.

Figure 7:
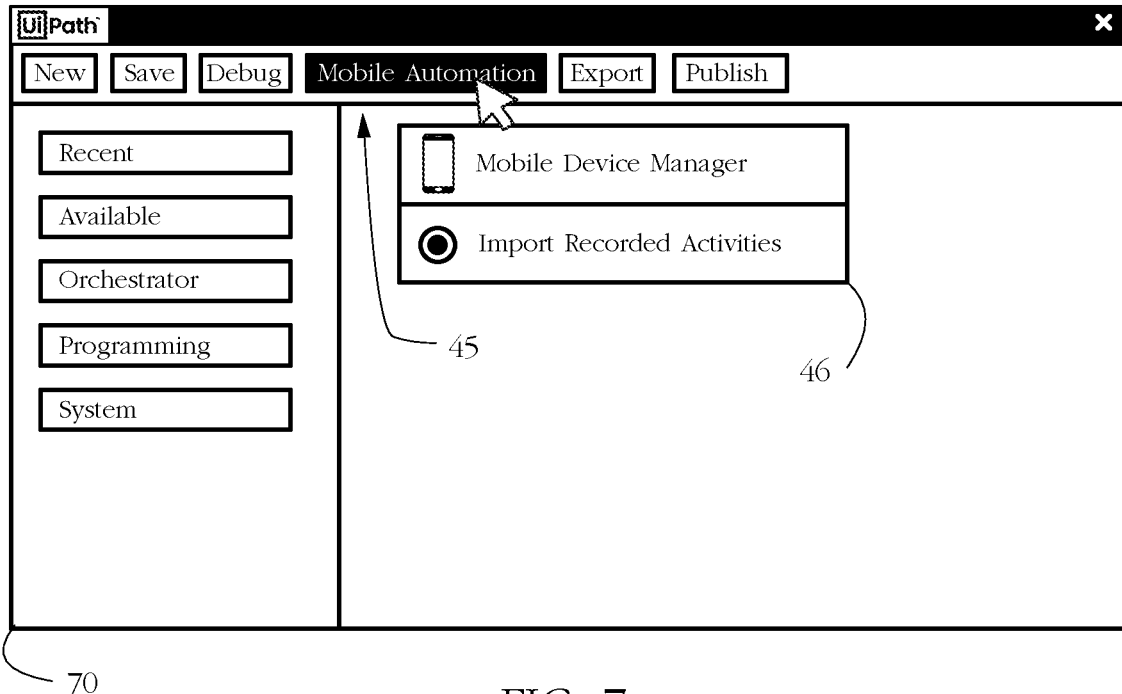
FIG. 7 shows an exemplary robot design interface exposed by the RPA design application according to some embodiments of the present invention.

In some embodiments, RPA design application 30 exposes a robot design interface (e.g., a GUI) enabling a user to indicate a desired automation activity to be performed by RPA robot 12. FIG. 7 illustrates such an exemplary robot design GUI 70 according to some embodiments of the present invention. To facilitate automation of mobile devices, some embodiments include a menu element (e.g., a button) 45 which, when activated, displays a sub-menu of mobile automation-specific options which may include, among others, invoking mobile device manager 56 and importing a recorded sequence of activities. Such functionality is further detailed below.

Figure 8:
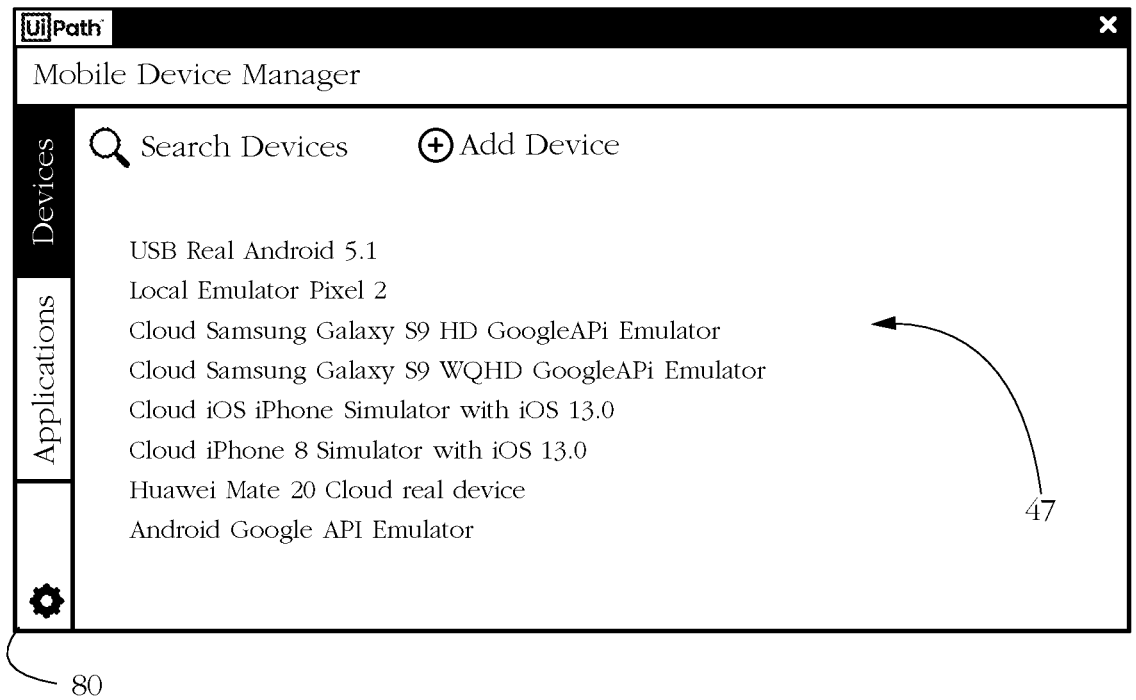
FIG. 8 shows an exemplary user interface exposed by a mobile device manager module according to some embodiments of the present invention.

In some embodiments, invoking mobile device manager 56 causes RPA design application to display a GUI specific to manager 56. FIG. 8 shows such an exemplary mobile device manager GUI 80, which displays a list of device aliases 47, each device alias representing a pre-configured RPA mobile device currently connected or available for connecting to. In some embodiments, each device alias 47 represents a (possibly distinct) device type. Unless otherwise specified, a device type is characterized by a tuple of device features, which may include an appliance type (e.g., smartphone, tablet computer, smartwatch, etc.) co-occurring with a make, a model of the respective device, and a version of an operating system (e.g. iOS™, Android™, etc.), among others. In some embodiments, the tuple of device features further includes an RPA target application executing on the respective device.

Figure 9:
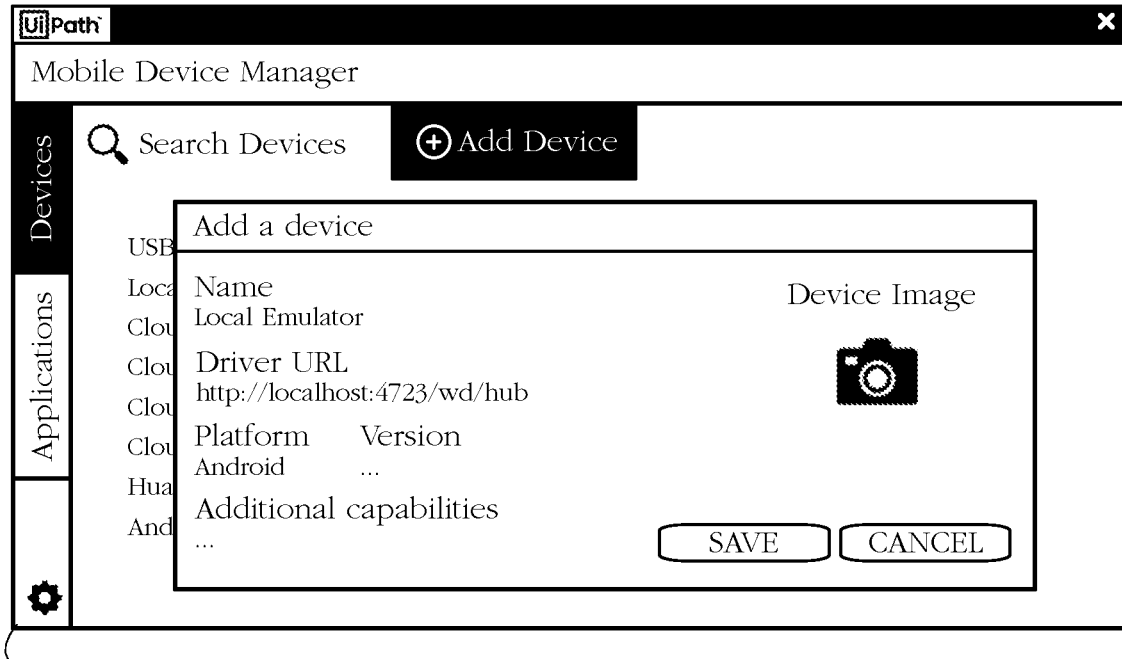
FIG. 9 illustrates an exemplary functionality of the mobile device manager module according to some embodiments of the present invention.

Interface 80 may include controls for searching among the available RPA mobile devices and/or for adding a model device/alias. In some embodiments, clicking the control for adding a new device may open a device configuration interface as illustrated in FIG. 9. The device configuration interface may include a set of input fields configured to receive user input comprising various characterizing features of the respective model device. Exemplary input fields include a device name (alias), a type and version of an operating system executing on the respective model device, and an indicator of a location of a robot driver of the respective device (see e.g., drivers 236a-c and/or 336 in FIG. 6).

Figure 10:
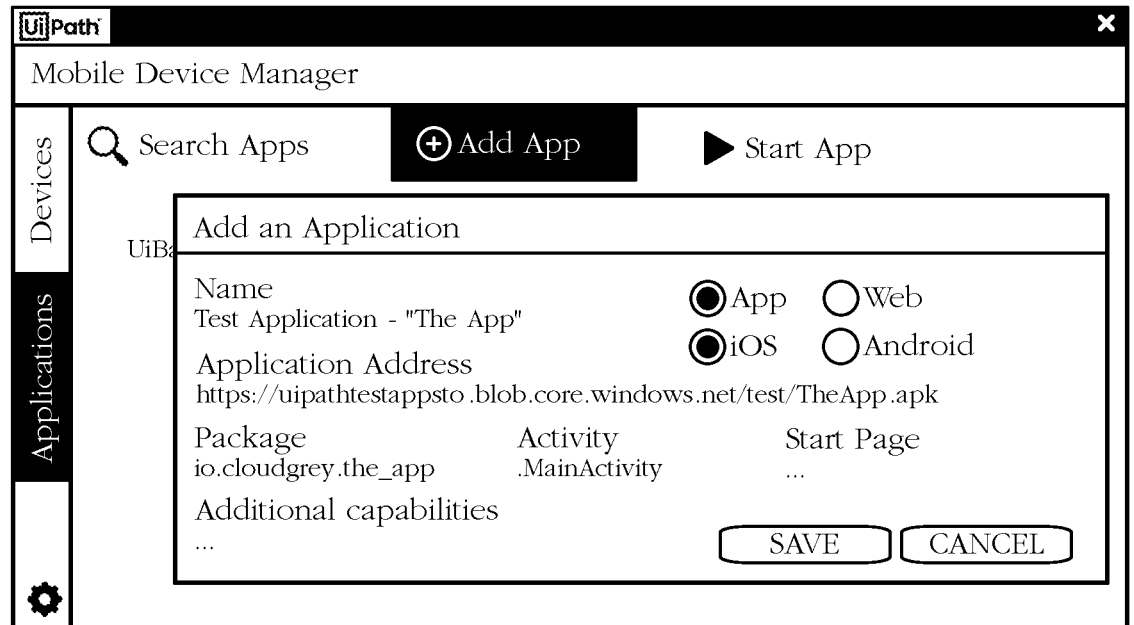
FIG. 10 illustrates another exemplary functionality of the mobile device manager module according to some embodiments of the present invention.

Mobile device manager GUI 80 may further include a set of control for specifying RPA target applications, i.e., applications that may be targeted for automation on a selected model device. In some embodiments, GUI 80 may display a list of application aliases and controls for searching and adding target applications. Clicking the control for adding a new application may open an application configuration interface as illustrated in FIG. 10. The application configuration interface may include a set of input fields configured to receive user input comprising various characterizing features of the respective RPA target application. Such characterizing features may include, among others, an application name (alias), an indicator of a type of application (Web vs. native), an indicator of an operating system for which the respective application was developed, and an indicator of a location (e.g., URL) of an executable file/package/installer of the respective application.

Figure 11:
FIG. 11 illustrated yet another exemplary functionality of the mobile device manager module according to some embodiments of the present invention.

GUI 80 may further include a control for starting an instance of a selected application on a selected RPA model device 28. Clicking the respective control may open a connection dialog window as illustrated in FIG. 11. An exemplary dialog window may enable a user to indicate a target device and an application, for instance by selecting an item from the list of device aliases and another item from the list of application aliases. Validating the selection (for instance by clicking "Connect") may cause mobile device manager 56 to establish a connection with the selected RPA model device having the respective characteristics and executing the respective target application.

Figure 12:
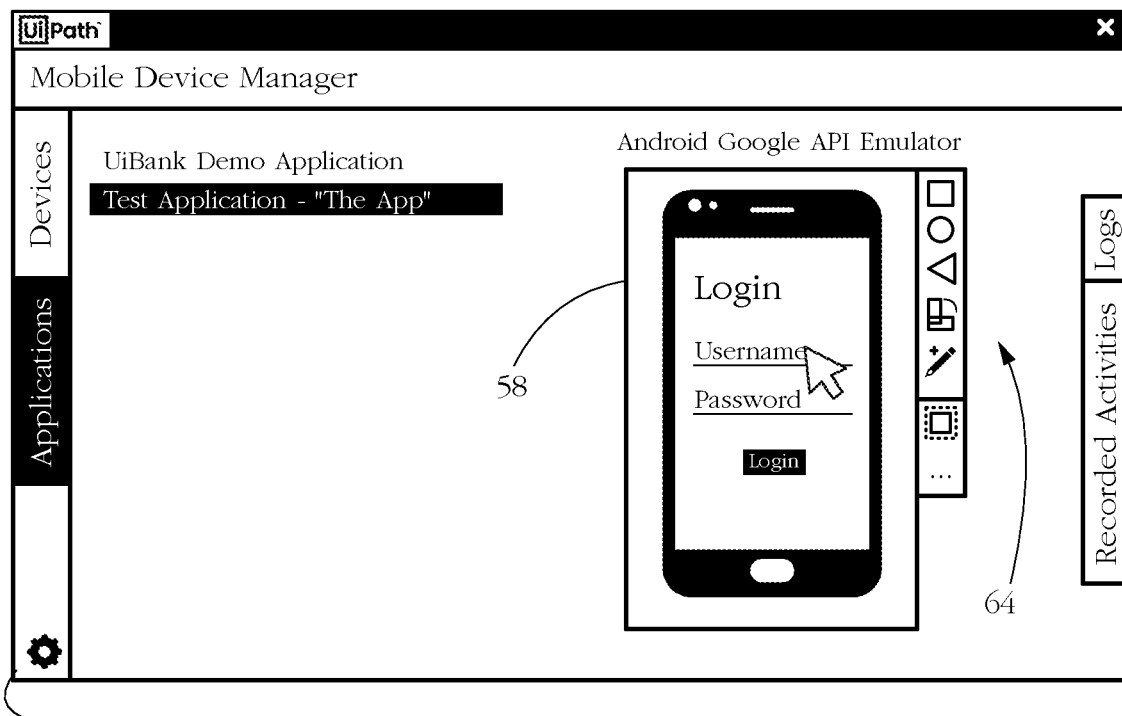
FIG. 12 shows the mobile device manager module exposing a model GUI according to some embodiments of the present invention.

In response to a successful connection to RPA model device 28, some embodiments may expose a model GUI 58 to the user, as illustrated by the exemplary view illustrated in FIG. 12. Model GUI 58 may show an image reproducing a physical appearance of RPA model device 28 (e.g. smartphone of a specific make and model), as well as a current content of a display of model device 28. In some embodiments, model GUI 58 further includes an RPA activity menu 64 wherein some menu items may correspond to various activities and/or user gestures (e.g., pressing a hardware button or a combination of hardware buttons, tapping, swiping, pinching the screen, changing the orientation and/or inclination of the device, etc.)

Selecting an item from menu 64 may thus enable the user to perform the respective activity (e.g., execute the respective user gesture) on the respective emulated device. In response, model GUI 58 may display a result of the user's performing the respective activity.

Figure 13:
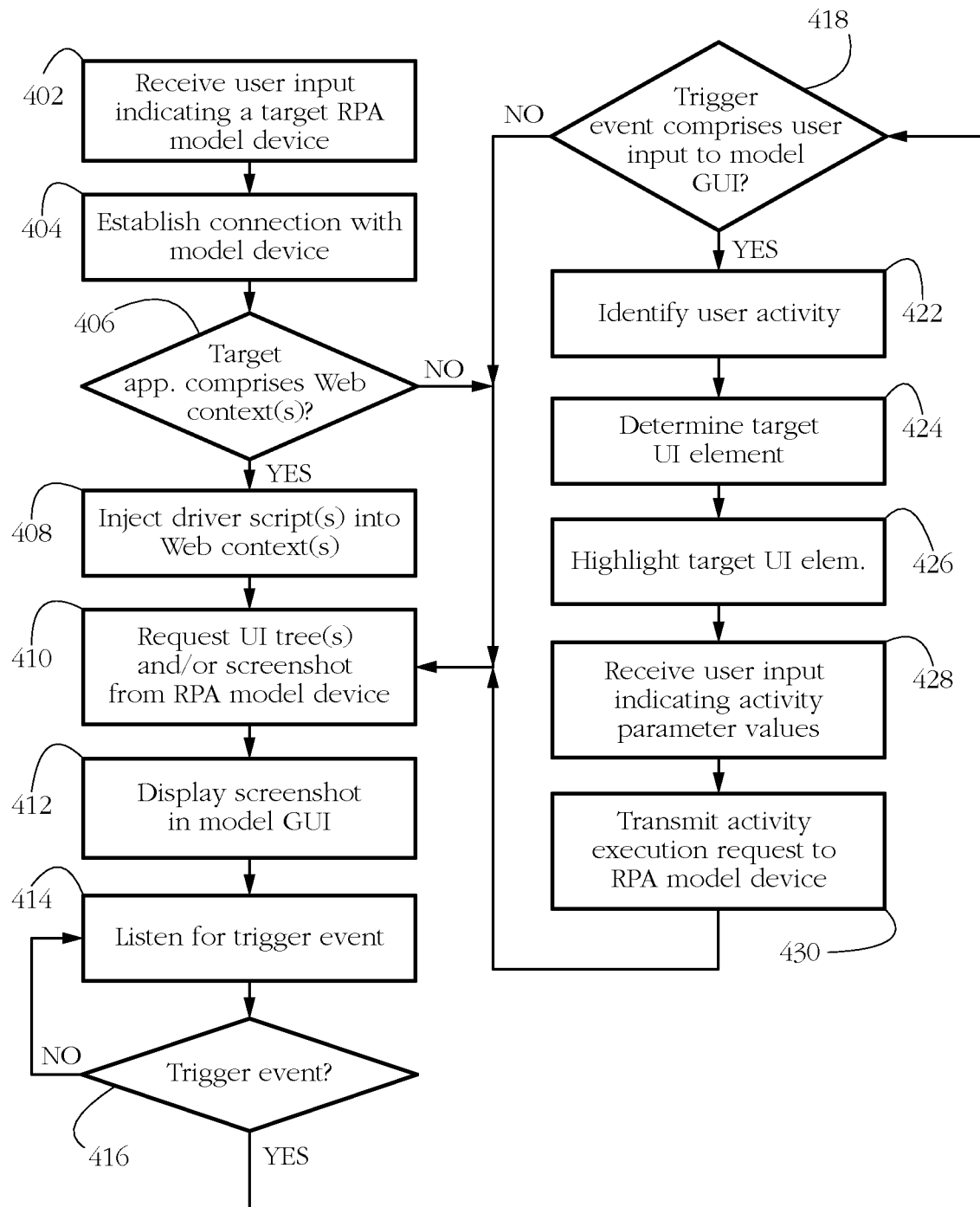
FIG. 13 shows an exemplary sequence of steps performed by the mobile device manager module according to some embodiments of the present invention.

FIG. 13 shows an exemplary sequence of steps performed by mobile device manager 56 according to some embodiments of the present invention. In a step 402, manager 56 may receive user input indicating a choice of RPA model device, e.g., by registering that a user has clicked on a device alias (see FIG. 8 and associated description above). In response, in a step 404, manager 56 may establish a connection with the respective model device 28. A further step 406 may determine whether RPA target application 34 comprises a web context, which herein denotes a region of a GUI exposed by the respective target application, the region displaying web content, for instance encoded as HTML or JavaScript. An exemplary web context includes a browser window. Web contexts are exposed by Web-based applications and hybrid applications, the latter combining native and web contexts in the same GUI. In contrast, native applications are compiled specifically for the respective type of mobile device and expose GUIs exclusively comprising native controls/UI elements, i.e., UI elements generated and controlled by the operating system of the respective model device.

When the GUI targeted for automation includes at least one web context, in a step 408 some embodiments may employ drivers 236 and/or 336 to inject a set of driver scripts into the respective web context. Such scripts comprise snippets of code which enable mobile device manager 56 to remotely interact with UI elements exposed within the web context(s) of the GUI exposed by RPA target application 34. Exemplary driver scripts may be formulated in a version of JavaScript.

Next, in a step 410, some embodiments may employ drivers 236/336 to retrieve an encoding of a content of the GUI currently exposed by RPA model device 28. In one such example, step 410 may comprise fetching a representation of the UI tree of the currently displayed GUI. The UI tree comprises a tree-like hierarchy of UI objects of the respective GUI, the tree including the plurality of UI elements currently displayed by the GUI. The UI tree may be encoded in a computer-readable format such as XML or JSON, among others. When the respective GUI comprises both native and web-based contexts, some embodiments retrieve both native and Web-context UI trees. Retrieving the representation of a whole UI tree may allow some embodiments to perform certain calculations such as identifying activity targets locally, i.e., on the machine executing mobile device manager 56. Some embodiments rely on the observation that such processing may be more computationally efficient than, for instance, individually fetching data characterizing each UI element since it can be achieved with substantially fewer requests issued to RPA model device 28. In some embodiments, step 410 further comprises requesting a screenshot of the current display of model device 28. The screenshot may then be displayed to the user within model GUI 58 (see e.g., FIG. 12).

A sequence of steps 414-416 may listen for trigger events. In some embodiments, trigger events comprise events that may trigger a change in the appearance of the display of model device 28. Such changes may warrant a re-execution of step 410 (fetching contents of the UI tree of the currently displayed GUI context). One example of trigger event is receiving a user input indicating the user interacting with model device 28, e.g., executing a gesture such as a tap or a swipe. Such gestures may be registered via model GUI 58. In some embodiments, other trigger events include scheduled/internal clock events. In one such example, model GUI 58 may be refreshed at 10 second intervals, even in the absence of any user interaction.

When a trigger event is detected, a further step 418 may determine whether the trigger event comprises an action of the user, and when yes, a step 422 may identify an RPA activity that the user is currently indicating. In some embodiments, step 422 may comprise identifying the activity according to a user selection from activity menu 64 (e.g. the user may select "Tap" to indicate the intention of tapping on a button). In a further step 424, mobile device manager 56 may determine the target UI element of the current RPA activity. Step 424 may comprise, for instance identifying which UI element (e.g., button, form field) is currently displayed in a region of model GUI 58 where the mouse pointer is currently located, or at the screen coordinates of the latest mouse click. The determination may be made according to the content of the recently retrieved UI tree(s) and optionally according to other information, such as a content of the screenshot received from model device 28. In one example, step 410 may include determining whether the mouse cursor (or the screen coordinates of the latest mouse click) is located within a native GUI context or a web context, and selecting the appropriate UI tree accordingly. Such determinations may proceed according to any method known in the art and are beyond the scope of the present description.

Figure 14:
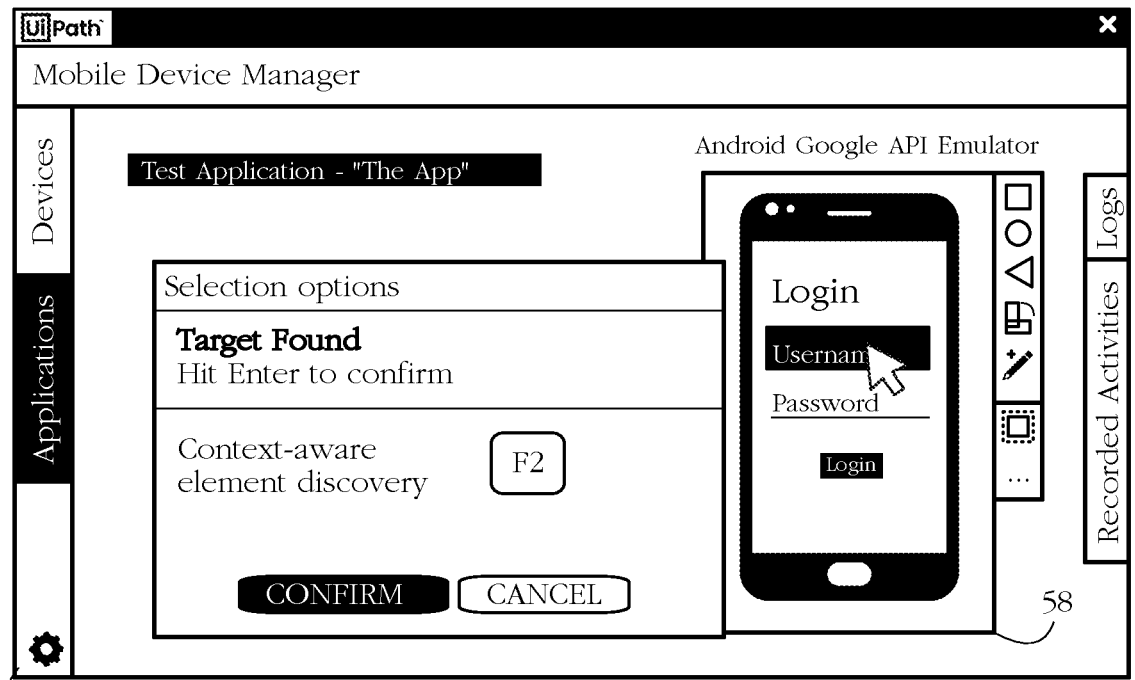
FIG. 14 shows using the mobile device manager module to configure a mobile RPA activity according to some embodiments of the present invention.

Once the target UI element is identified, some embodiments highlight the respective UI element in a step 426. Highlighting may comprise, for instance, drawing a rectangle around the respective UI element to indicate it to the user. One such example is illustrated in FIG. 14, wherein the user has clicked on a "Username" form field exposed within model GUI 58. In response to a positive identification, the respective form field is highlighted by changing its appearance/background color.

In situations where the target UI element is not identifiable according to UI tree data, some embodiments may ask the user whether to employ alternative methods of identifying the target UI element. FIG. 14 shows an exemplary popup message exposed by mobile device manager GUI 80 in response to the user clicking on a UI element (e.g. the "Username" button). In the illustrated example, the popup communicates that the target was positively identified. For other situations, the popup may expose a control that enables the user to request identification by alternative methods (in the illustrated example, a context-aware identification). Such methods go beyond the scope of the present description.

Figure 15:
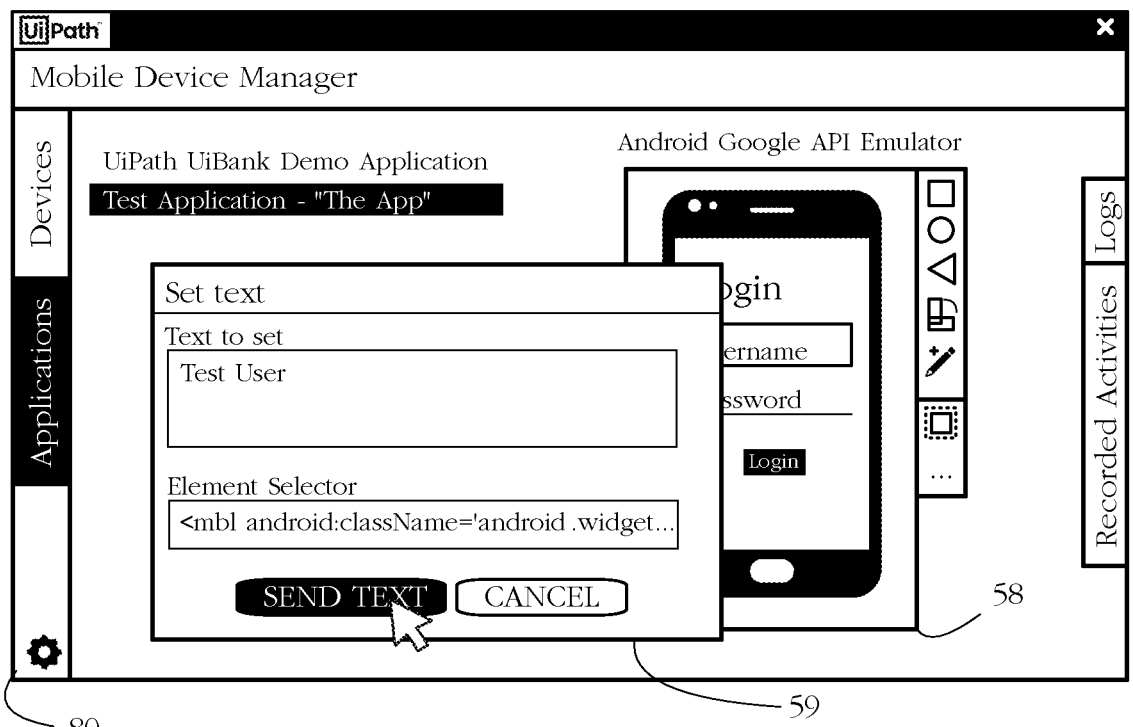
FIG. 15 illustrates using the mobile device manager module to configure another mobile RPA activity according to some embodiments of the present invention.

In some embodiments, a step 428 may receive user input indicating various activity parameter values. FIG. 15 shows such an example of configuring an exemplary activity comprising filling out a form field. In response to selecting the respective form field (e.g., Username) as target of the activity, the user may be presented with a popup activity configuration window 59 enabling the user to indicate values of various parameters specific to the respective activity. In the illustrated example, such parameters include a text (e.g., "Test User") to be written to the respective target form field. In some embodiments, activity parameters further include a selector identifying the respective selected UI element among the plurality of UI elements currently exposed by the RPA application. The selector may be filled in automatically in response to a positive identification of the respective target element. However, some embodiments allow the user to manually edit the selector.

In response to validating the respective activity, for instance by registering that the user has clicked on "Send Text" in FIG. 15, a step 430 may employ drivers 236/336 to transmit an activity execution request to RPA model device 28, the activity execution request instructing device 28 to carry out the current activity (in the example of FIG. 15, to write "Test User" into the "Username" form field). Some embodiments may then re-execute step 410 to refresh the content of model GUI 58.

Figure 16:
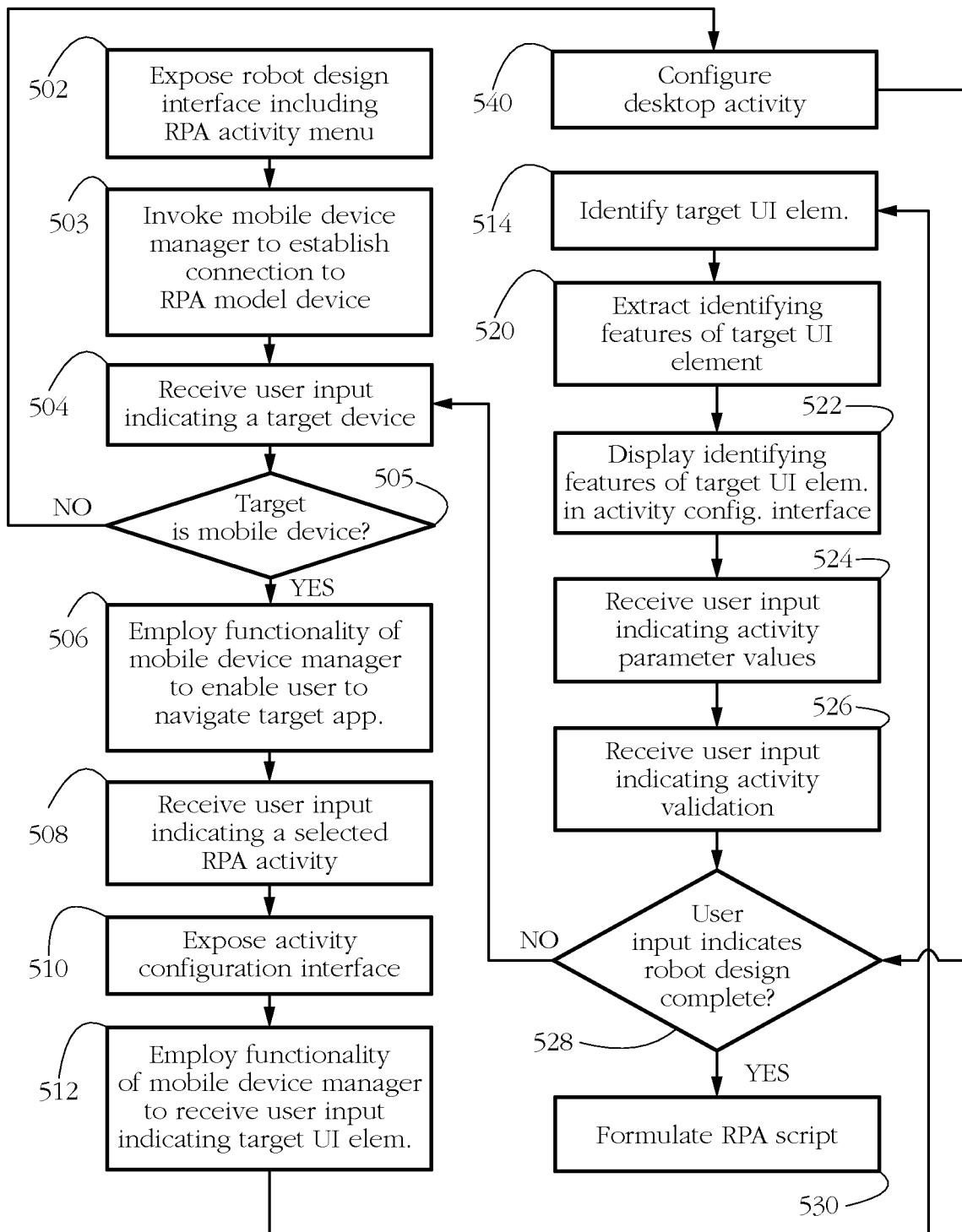
FIG. 16 shows an exemplary sequence of steps performed by the RPA design application according to some embodiments of the present invention.
Figure 17:
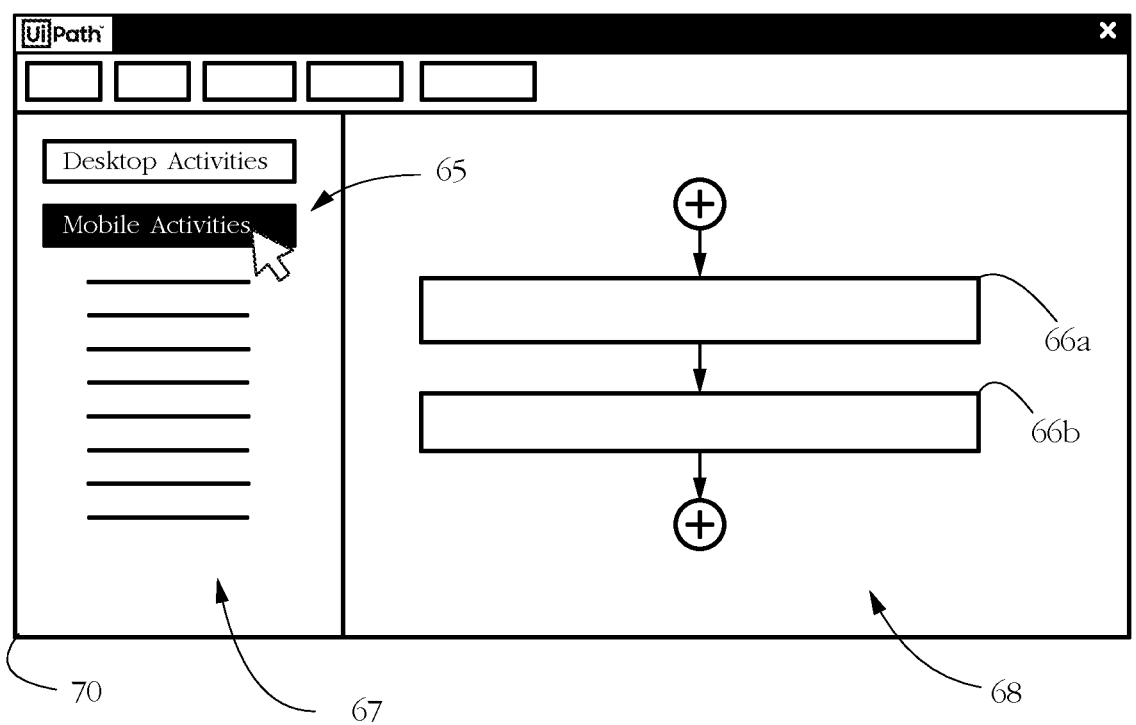
FIG. 17 shows an exemplary view displayed by the robot design interface of the RPA design application according to some embodiments of the present invention.

Various functional aspects of mobile device manager 56 described above may be used by RPA design application 30 to facilitate robot design. An exemplary sequence of steps performed by RPA design application 30 is illustrated in FIG. 16. In a step 502, application 30 exposes a robot design interface to the user, the interface enabling a user to indicate a set of activities to be executed by RPA robot(s) 12. FIG. 17 illustrates an exemplary robot design GUI 70 having a menu area 67 and a workflow design area 68. Menu area 67 comprises an activity menu enabling the user to select individual RPA activities and to indicate an application targeted for automation, among others. In some embodiments, activities may be reached via a hierarchy of menus. Activities may be grouped according to various criteria, for instance according to a type of RPA target application (e.g., MS Excel™ activities, web activities, email activities), and/or according to a type of interaction (e.g., mouse activities, hotkey activities, data grabbing activities, form filling activities, etc.)

Figure 18:
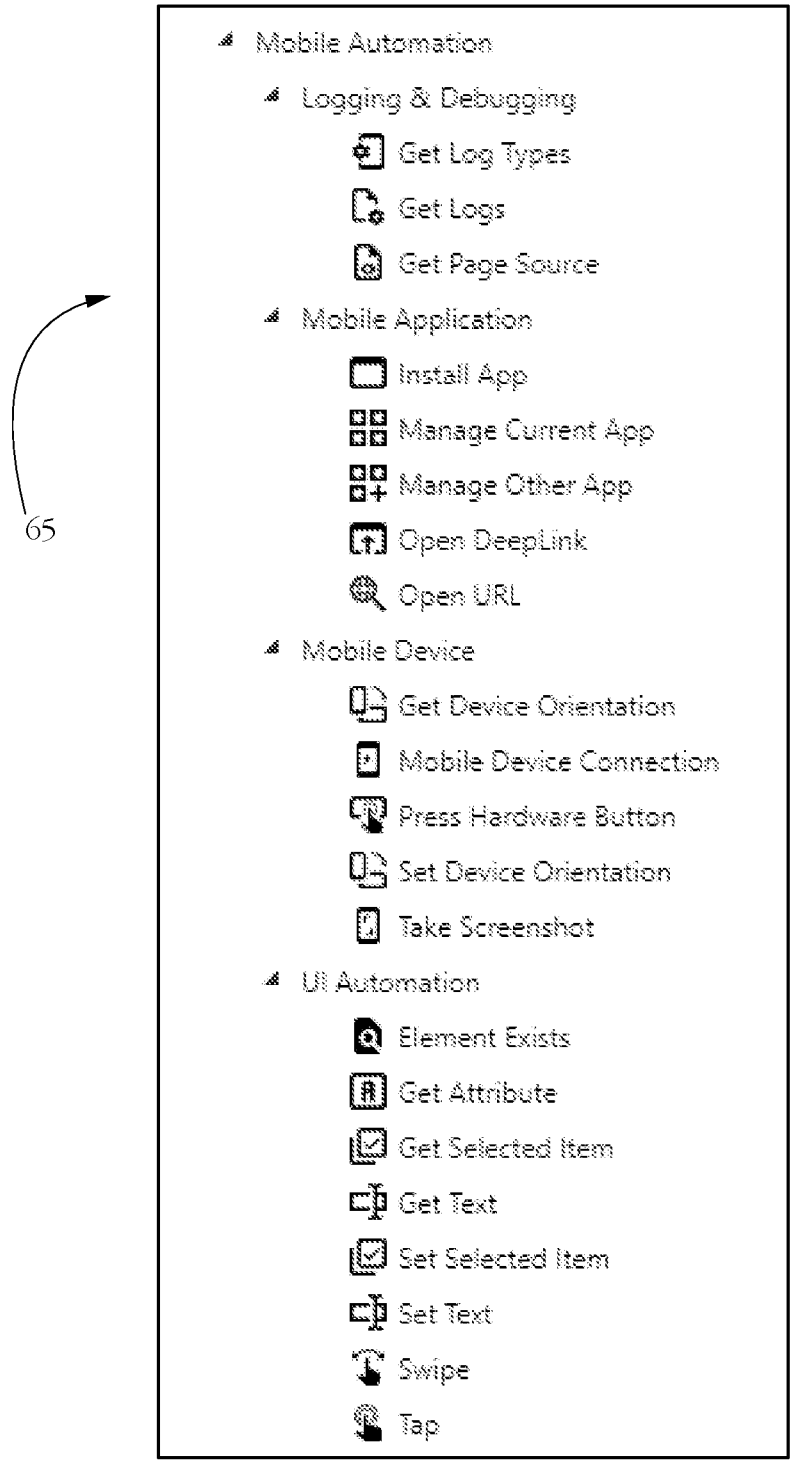
FIG. 18 shows an exemplary menu of mobile automation activities exposed by the RPA design application according to some embodiments of the present invention.

In some embodiments, activities may be further grouped according to a target device type, for instance all RPA activities for automating mobile computing devices/applications may be grouped together into a "mobile activities" submenu 65, while RPA activities for automating desktop computers/applications may be gathered into a "desktop activities" submenu, as illustrated in FIG. 17. FIG. 18 further illustrates exemplary items of a "mobile activities" submenu 65 according to some embodiments of the present invention. Mobile-specific activities reflect the fact that, in contrast to desktop computers wherein the user typically interacts indirectly with GUI elements by using a pointing device (e.g., mouse) to move a cursor on the screen, interaction with mobile devices typically comprises directly touching the screen in specific way commonly known as user gestures. In some embodiments, mobile-specific activities include user gestures such as a touchscreen tap (which may have several variations such as a short tap and a long tap, for instance), a touchscreen swipe, a touchscreen pinch, changing an inclination/posture of the respective device, and changing an orientation/rotating the respective device, among others.

In some embodiments, workflow design area 68 displays a diagram of a set of activities to be carried out by robot(s), the activities effectively mimicking the flow of a business process being automated. Each activity may be represented by a separate graphical element (icon, etc.). In a preferred embodiment, each activity is represented by an activity container 66*a-b*. Containers 66*a-b* may be ordered in sequence to indicate a desired order of execution of the respective activities. In some embodiments, each activity may be configured independently, by way a configuration interface, for instance displayed within each container. The activity configuration interface may be structured according to a type of the respective activity (e.g., touchscreen tap vs. reading data from a spreadsheet cell) and may enable the user to set values of activity-specific parameters, as shown in more detail below. Workflow design area 68 may further include controls for adding, deleting, moving, connecting, and/or rearranging activity containers.

Figure 19:
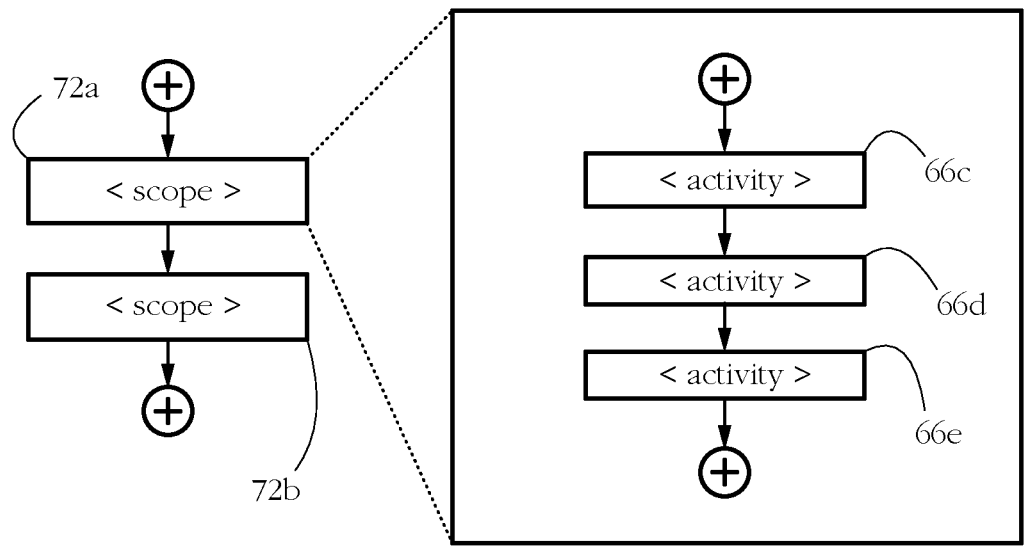
FIG. 19 shows grouping RPA activities into scopes according to some embodiments of the present invention.

In some embodiments, multiple activity containers may be grouped together into larger scope containers, as illustrated in FIG. 19, wherein a scope container 72*a* includes activity containers 66*c-e*. In some embodiments, all members of a scope container share a set of common features, so grouping activities into containers may save a developer time, for instance by avoiding having to configure all parameters for all activities; shared parameter values may be automatically filled in.

Figure 20:
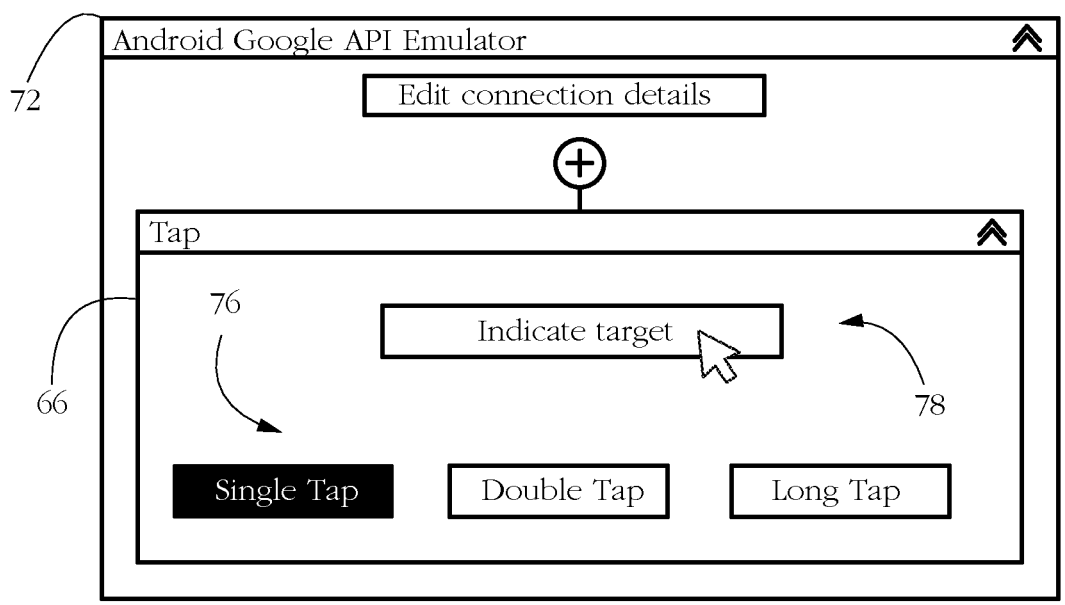
FIG. 20 shows exemplary scope- and activity configuration interfaces according to some embodiments of the present invention.

In some embodiments, activities may be grouped into scope containers 72*a-b* according to an identity of a target RPA device and/or according to an identity of a robot configured to carry out the respective activity. Stated otherwise, automation activities designed to be performed on a first device may be grouped together into one scope container representing the first device, while automation activities to be carried out on another device may be grouped into another scope container representing the second device. FIG. 20 shows an exemplary activity container 66 included into a device scope container 72 according to some embodiments. Scope container 72 may display a title that is indicative of an associated target device and/or of an RPA model device 28. For instance, the name of the scope container may comprise the device alias of the currently connected RPA model device 28 (see e.g., device aliases 47 in FIG. 8.) Scope container 72 may further comprise a control, herein illustrated as a button labeled 'Edit connection details', for configuring the respective RPA model device. In some embodiments, activating the respective control may invoke mobile device manager's device configuration GUI (see e.g., GUI 80 in FIGS. 8-9-10-11 and associated description above).

A skilled artisan will appreciate that the use of scope containers is herein meant to be illustrative and non-limiting. Alternative ways of visually indicating the target device of each automation activity may include, for instance, attaching a device-specific icon to each activity, coloring activity containers differently according to their intended target device, etc.

In a step 503 (FIG. 16), RPA design application 30 may invoke mobile device manager 56 to establish a connection with RPA model device 28, and to enable the user to interact with model device 28 remotely, via model GUI 58 as described above.

Some embodiments of RPA design application 30 bring together the design of desktop and mobile activities into the same workflow design area 68, enabling the user to easily switch between desktop and mobile, as well as to design complex workflows involving multiple devices. In such embodiments, a step 504 may receive user input indicating a target device for the automation activity currently being designed/configured. Step 504 may be carried out in various ways. In one example, application 30 may automatically determine the target device according to the automation activity. For instance, when the user selects a mobile-specific activity (see step 508 below), RPA design application 30 may determine that the target device is a mobile device and thus invoke the functionality of mobile device manager 56. In another example, RPA design application 30 may automatically determine the target device of the current activity according to the identity of a scope container that includes the current activity. For instance, when the user adds an activity to a scope container associated with an RPA model device, application 30 may identify the respective mobile device as the target of the respective activity and invoke mobile device manager 56 to configure it. In yet another example, application 30 may include a dedicated control enabling the user to explicitly indicate the target device.

When the target device is a desktop computer (e.g., when the automation activity currently being configured is desktop-specific or intended to be executed on a personal computer/server as opposed to a mobile computing device), a step 540 may configure the respective desktop activity. Step 540 may include RPA design application 30 exposing a desktop UI, for instance by invoking an instance of RPA target application 34 on the computer system executing application 30. The user may then indicate a target UI element directly on the UI of target application 34. Application 30 may interact with the respective target UI via desktop driver(s) 136 (FIG. 6.) Details of configuring desktop automation activities are beyond the scope of the present description.

When the target device is a mobile computing device, a step 506 may invoke mobile device manager 56 to enable the user to interact with RPA model device 28 via model GUI 58, for instance to navigate to a specific screen of RPA target application 34. In a step 508, RPA design application 30 may receive a user input indicating a selected RPA activity, for instance by registering a user input indicating a selected item (e.g., "Tap") from activity menu 65 or 64. A step 510 may then expose an activity configuration interface for the respective activity. FIG. 20 illustrates an exemplary activity configuration interface exposed inside device container 66, the activity configuration interface comprising an activity title ("Tap" in the current example), and a set of controls 76, 78 for setting activity-specific parameter values. One exemplary set of controls 76 enables a user to indicate an activity sub-type of the respective activity. In the illustrated example, the user may select whether the current activity is a single, double, or long tap. Another exemplary control 78 may enable the user to indicate a target UI element, i.e., the UI element that is the target of the respective activity, for instance which UI element to tap on.

In a sequence of steps 512-514, some embodiments may receive user input indicating a target UI element for the current activity, and respectively identify the selected target UI element. Some embodiments expose model GUI 58 to enable the user to indicate the target element directly, for instance by pointing and/or clicking it with a mouse.

In a further step 520, RPA design application 30 may extract identifying features of the selected target UI element, such as an image of the selected target element and/or a text/label displayed on top or next to the selected target element. In response to extracting identifying features of the selected target element, in a step 522 some embodiments may display some of the identifying features to the user. For instance, activity container 66 may display a selector and/or an image of the respective UI element (e.g., button). A further step 524 may receive user input indicating other parameter values of the current activity.

In response to receiving user input validating the choice of target element (step 526, for instance the user clicking an OK or Confirm button), some embodiments employ the functionality of mobile device manager 56 to enable the user to advance to the next step of the automation workflow (step 504). In some embodiments, model GUI 58 is updated to show a result of executing the latest designed activity. When application 30 receives user input indicating that the design process is complete, a step 530 may formulate RPA script 40 corresponding to the designed workflow.

Figure 21:
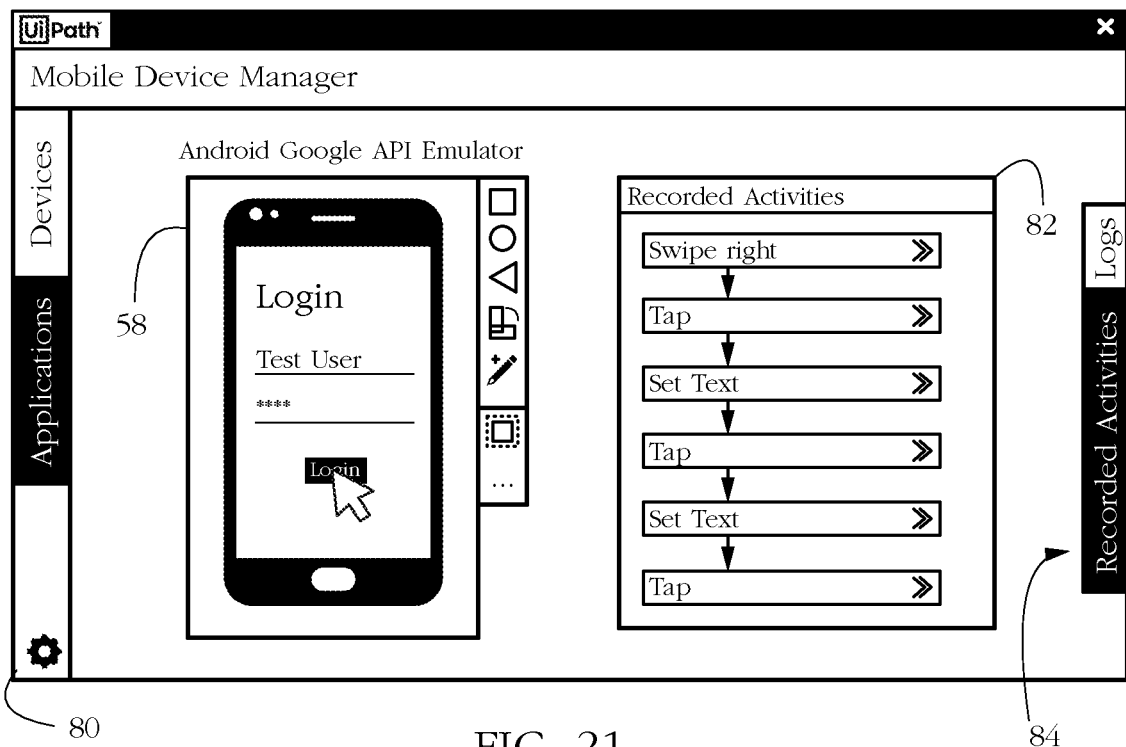
FIG. 21 shows an alternative exemplary sequence of steps performed by the RPA design application according to some embodiments of the present invention.

Some embodiments enable an alternative manner of designing an RPA workflow by using mobile device manager 56 to record a sequence of user activities, and subsequently importing the respective sequence into a workflow design interface of RPA design application 30. In one exemplary recording session, the user may swipe right to expose a login screen, then tap to select a "Username" field, then fill in a text, then tap to select a "Password" field, fill it in with another text, then tap the "Login" button. FIG. 21 shows a view of device manager GUI 80 during such an activity recording session according to some embodiments of the present invention. GUI 80 may display a recorded activity window 82 showing a recorded sequence of actions (swipe-tap-set text-tap-set text-tap for the exemplary sequence of user actions described above). The recorded activity window 82 may be accessed via a dedicated control (e.g., button 84) of GUI 80.

Figure 22:
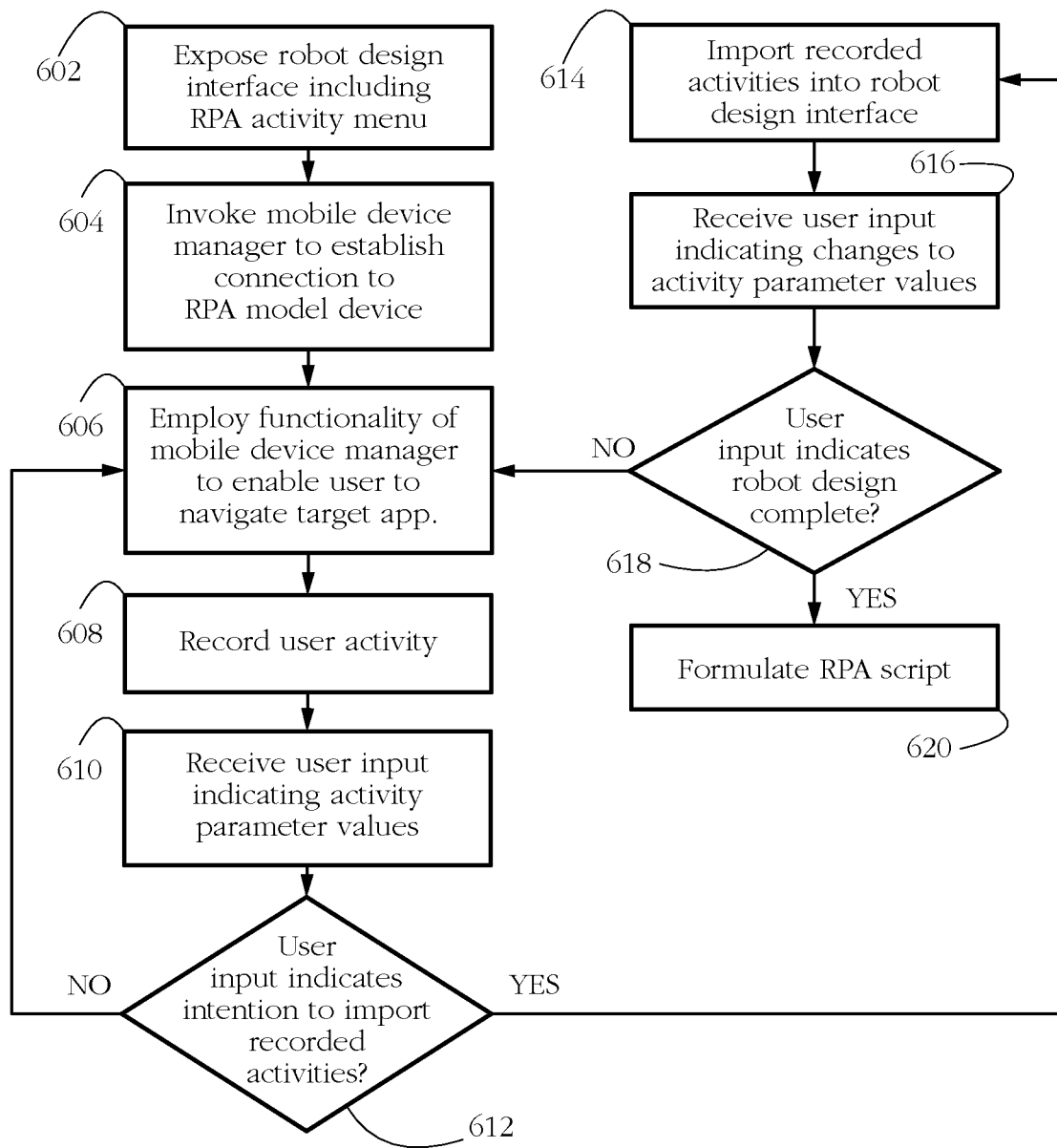
FIG. 22 illustrates an exemplary activity recording functionality of the mobile device manager module according to some embodiments of the present invention.

FIG. 22 shows an exemplary sequence of steps performed by RPA design application 30 in collaboration with mobile device manager 56 to design an RPA workflow using an activity recording feature according to some embodiments of the present invention. In response to exposing robot design interface 70 and employing manager 56 to establish a connection with RPA model device 28 (steps 602-604), a step 606 may use device manager 56 to enable the user to interact with RPA model device 28 to indicate a sequence of activities, for instance as described above. For each activity (tapping, filling in form fields, etc.), a sequence of steps 608-610 may register a type of the respective activity and activity-specific parameter values input by the user.

Some embodiments expose a control enabling the user to signal an end of the recorded activity sequence, and to instruct application 30 to import the recorded sequence of activities into the workflow design area of the robot design interface. See e.g., a menu item labelled "Import recorded activities" illustrated in FIG. 7. When the user activates the respective control (step 612), in a step 614 RPA design application may import the recorded sequence of activities. Importing may comprise, for each activity, creating an activity container 66 associated with the respective activity and automatically populating container 66 with parameter values characterizing the respective activity. Such parameter values may be automatically determined and/or user-provided. The automatically created activity containers 66 may be displayed to the user for editing and/or validation (step 616). The sequence of steps 606-616 may be executed again to record a new sequence of activities. Otherwise, when the user indicates that robot design is complete, a step 620 may formulate RPA script(s) encoding the designed RPA workflow.

Figure 23:
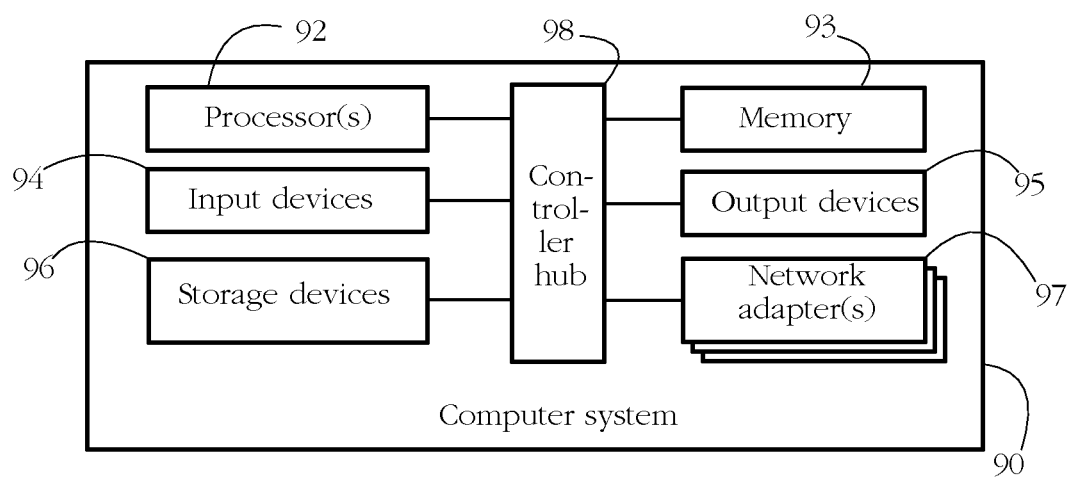
FIG. 23 shows an exemplary hardware configuration of a computer system configured to execute some embodiments of the present invention.

FIG. 23 shows an exemplary hardware configuration of a computing device programmed to execute some of the methods described herein. The respective computing device may represent any of RPA hosts 20*a*-*e* in FIG. 3, the computer system executing device emulator 60, or the computer executing RPA design application 30. The illustrated configuration corresponds to a personal computer. Other computing devices such as servers, mobile telephones, tablet computers, and wearables may have slightly different configurations. Processor(s) 92 comprise a physical device (e.g. microprocessor, multi-core integrated circuit formed on a semiconductor substrate) configured to execute computational and/or logical operations with a set of signals and/or data. Such signals or data may be encoded and delivered to processor(s) 92 in the form of processor instructions, e.g., machine code. Processor(s) 92 may include a central processing unit (CPU) and/or an array of graphics processing units (GPU).

Memory unit 93 may comprise volatile computer-readable media (e.g. dynamic random-access memory—DRAM) storing data/signals/instruction encodings accessed or generated by processor(s) 22 in the course of carrying out operations. Input devices 94 may include computer keyboards, mice, and microphones, among others, including the respective hardware interfaces and/or adapters allowing a user to introduce data and/or instructions into RPA host 20. Output devices 95 may include display screens and speakers, among others, as well as hardware interfaces/adapters such as graphic cards, enabling the respective computing device to communicate data to a user. In some embodiments, input and output devices 94-95 share a common piece of hardware (e.g., a touchscreen). Storage devices 96 include computer-readable media enabling the non-volatile storage, reading, and writing of software instructions and/or data. Exemplary storage devices include magnetic and optical disks and flash memory devices, as well as removable media such as CD and/or DVD disks and drives. Network adapter(s) 97 enable the respective computing device to connect to an electronic communication network and/or to other devices/computer systems.

Controller hub 98 generically represents the plurality of system, peripheral, and/or chipset buses, and/or all other circuitry enabling the communication between processor(s) 92 and the rest of the hardware components of RPA host 20. For instance, controller hub 98 may comprise a memory controller, an input/output (I/O) controller, and an interrupt controller. Depending on hardware manufacturer, some such controllers may be incorporated into a single integrated circuit, and/or may be integrated with processor(s) 92. In another example, controller hub 98 may comprise a northbridge connecting processor 92 to memory 93, and/or a southbridge connecting processor 92 to devices 94, 95, 96, and 97.

The exemplary systems and methods described above enable unifying the automation of desktop computers with that of mobile computing devices such as mobile telephones, tablet computers, and wearables. Unification is achieved by bringing together multiple device types and device-specific automation activities within a single user-friendly design interface.

Automation of mobile computing devices presents a special set of technical challenges, such as bridging the substantial heterogeneity of the mobile device market. Due to the relatively high degree of variability in the hardware and software specifications of mobile devices, carrying out robotic process automation of mobile computing devices is expected to require substantial hardware and software skills and knowledge that typically exceeds those of an average developer. Conventional development tools typically focus on just one operating system (e.g., either iOS™ or Android™) and one type of UI controls (e.g., either native or Web). Furthermore, device interaction methods developed for one type of device and/or operating system are not easily portable to other devices and operating systems.

Another technical hurdle in the way of automating mobile computing devices is that the user interfaces operating on such devices may differ substantially from user interfaces of desktop computers. For instance, users typically interact with mobile devices via hand gestures executed on a touchscreen, as opposed to by moving a cursor on a screen as in classical computing. Therefore, conventional RPA design software historically designed for automating processes executed by desktop computers and servers may lack a set of tools for configuring activities which are specific to mobile devices, e.g., gestures such as touchscreen swiping and pinching, and changing the orientation of the automated device.

Some embodiments address such shortcomings by expanding the functionality of an existing RPA design software suite (e.g., UiPath Studio™) to include mobile-specific activities. Furthermore, some embodiments connect to an RPA model device acting as a substitute for the intended automation target device (e.g., a smartphone of a specific make and model) and display a model GUI mirroring the content of a display of the respective model device. The model device itself may be real or emulated and may execute locally or remotely, for instance as a commercial device emulator service. The model GUI enables a developer to select and configure mobile-specific activities directly from the robot design interface, as well as to observe the execution of the respective activities in quasi-real time. Some embodiments may further enable the developer to indicate UI target elements (e.g., buttons to tap, text fields to fill, etc.) directly on the model GUI. Some embodiments unify automation of native, web-based, and hybrid applications by automatically detecting a type of GUI context the user is currently interacting with, and selecting the appropriate robot driver to call, all in a manner that is transparent to the user.

Some embodiments further expose a device management interface enabling a developer to instantiate a model device with the desired specifications, for instance a particular make and model of mobile telephone, executing a particular version of an operating system. The device management interface may further allow the developer to select a mobile application targeted for automation. In response to the user's selection, an instance of the selected application may be automatically provisioned to the respective RPA model device. Such improvements may facilitate access of non-technical developers to RPA of mobile devices and applications, without having to learn a new piece of software and without explicit coding.

Some embodiments may further enable a unified automation of processes which require a collaboration between multiple distinct devices. One such example comprises a two-factor authentication process, wherein a set of credentials required for accessing one device (e.g., personal computer) is delivered to another device (e.g., mobile telephone). Automation of such processes may require the collaboration of two robots, for instance wherein one extracts the credentials from the mobile telephone, while the other inputs them into the personal computer. In another hybrid automation example, a user would like to use a mobile phone to automatically send SMS messages to a list of contacts. However, the phone numbers and message contents must be retrieved from an Excel™ spreadsheet on the user's computer. Automation of such a process may require a mobile robot automating the composition and transmission of messages on the telephone, and another robot executing on the computer extracting structured data from Excel™. Yet another example may comprise a geolocation automation, wherein a mobile device's current GPS coordinates are automatically processed by a corporate server.

Some embodiments may allow a developer to design a unified workflow, wherein different sequences of activities may be executed on distinct devices, possibly by distinct robots. Activities targeting the same device may be grouped together into a device-specific container, facilitating robot design and producing a clear and intuitive visualization of the automated workflow.

It will be clear to one skilled in the art that the above embodiments may be altered in many ways without departing from the scope of the invention. Accordingly, the scope of the invention should be determined by the following claims and their legal equivalents.

The invention claimed is:

1. A method comprising employing at least one hardware processor of a computer system to:
   display a desktop graphical user interface (GUI) and a model GUI on a screen of the computer system, wherein the model GUI mimics a display of a mobile computing device targeted for robotic process automation (RPA);
   construct an RPA workflow comprising a first RPA activity for interacting with a desktop computer and a second RPA activity for interacting with the mobile computing device, wherein constructing the RPA workflow comprises:
      receiving a first user input to the desktop GUI,
      in response to the first user input, configuring the first RPA activity according to the first user input,
      receiving a second user input to the model GUI, and
      in response to the second user input, configuring the second RPA activity according to the second user input; and
   generate at least one robot specification according to the RPA workflow, the at least one robot specification instructing a first RPA robot to carry out the first RPA activity on the desktop computer and instructing a second RPA robot to carry out the second RPA activity on the mobile computing device.

2. The method of claim 1, wherein the RPA workflow performs a two-factor authentication procedure on the desktop computer and mobile computing device.

3. The method of claim 1, further comprising, in preparation for displaying the model GUI, employing the at least one hardware processor to:
   establish a connection with an RPA model device sharing a set of hardware and software characteristics with the mobile computing device; and
   retrieve a content of the model GUI from the RPA model device.

4. The method of claim 3, wherein the RPA model device comprises a software emulation of the mobile computing device.

5. The method of claim 1, further comprising employing the at least one hardware processor to display a graphical representation of the RPA workflow on the screen of the computer system.

6. The method of claim 5, wherein the graphical representation of the RPA workflow comprises a first container grouping RPA activities of the RPA workflow targeting the desktop computer and second container grouping RPA activities of the RPA workflow targeting the mobile computing device.

7. The method of claim 1, further comprising employing the at least one hardware processor to:
   display a first activity menu listing RPA activities for interacting with the desktop computer, and a second activity menu listing RPA activities for interacting with the mobile computing device;
   configure the first RPA activity further according to a user's selection from the first activity menu; and
   configure the second RPA activity further according to a user's selection from the second activity menu.

8. The method of claim 1, further comprising employing the at least one hardware processor to, in response to the second user input, update the model GUI to show a result of the second user input.

9. The method of claim 1, wherein the second RPA activity comprises executing a user gesture for interacting with the mobile computing device.

10. A computer system comprising at least one hardware processor configured to:
    display a desktop graphical user interface (GUI) and a model GUI on a screen of the computer system, wherein the model GUI mimics a display of a mobile computing device targeted for robotic process automation (RPA);
    construct an RPA workflow comprising a first RPA activity for interacting with a desktop computer and a second RPA activity for interacting with the mobile computing device, wherein constructing the RPA workflow comprises:
       receiving a first user input to the desktop GUI,
       in response to the first user input, configuring the first RPA activity according to the first user input,
       receiving a second user input to the model GUI, and
       in response to the second user input, configuring the second RPA activity according to the second user input; and
    generate at least one robot specification according to the RPA workflow, the at least one robot specification instructing a first RPA robot to carry out the first RPA activity on the desktop computer and instructing a second RPA robot to carry out the second RPA activity on the mobile computing device.

11. The computer system of claim 10, wherein the RPA workflow performs a two-factor authentication procedure on the desktop computer and mobile computing device.

12. The computer system of claim 10, wherein the at least one hardware processor is further configured, in preparation for displaying the model GUI, to:
    establish a connection with an RPA model device sharing a set of hardware and software characteristics with the mobile computing device; and
    retrieve a content of the model GUI from the RPA model device.

13. The computer system of claim 12, wherein the RPA model device comprises a software emulation of the mobile computing device.

14. The computer system of claim 10, wherein the at least one hardware processor is further configured to display a graphical representation of the RPA workflow on the screen of the computer system.

15. The computer system of claim 14, wherein the graphical representation of the RPA workflow comprises a first container grouping RPA activities of the RPA workflow targeting the desktop computer and a second container grouping RPA activities of the RPA workflow targeting the mobile computing device.

16. The computer system of claim 10, wherein the at least one hardware processor is further configured to:
   display a first activity menu listing RPA activities for interacting with the desktop computer, and a second activity menu listing RPA activities for interacting with the mobile computing device;
   configure the first RPA activity further according to a user's selection from the first activity menu; and
   configure the second RPA activity further according to a user's selection from the second activity menu.

17. The computer system of claim 10, wherein the at least one hardware processor is further configured to, in response to the second user input, update the model GUI to show a result of the second user input.

18. The computer system of claim 10, wherein the second RPA activity comprises executing a user gesture for interacting with the mobile computing device.

19. A non-transitory computer-readable medium storing instructions which, when executed by at least one hardware processor of a computer system, cause the computer system to:
   display a desktop graphical user interface (GUI) and a model GUI on a screen of the computer system, wherein the model GUI mimics a display of a mobile computing device targeted for robotic process automation (RPA);
   construct an RPA workflow comprising a first RPA activity for interacting with a desktop computer and a second RPA activity for interacting with the mobile computing device, wherein constructing the RPA workflow comprises:
      receiving a first user input to the desktop GUI,
      in response to the first user input, configuring the first RPA activity according to the first user input,
      receiving a second user input to the model GUI, and
      in response to the second user input, configuring the second RPA activity according to the second user input; and
   generate at least one robot specification according to the RPA workflow, the at least one robot specification instructing a first RPA robot to carry out the first RPA activity on the desktop computer and instructing a second RPA robot to carry out the second RPA activity on the mobile computing device.

* * * * *